(12) United States Patent
Johnsen et al.

(10) Patent No.: US 10,581,711 B2
(45) Date of Patent: Mar. 3, 2020

(54) SYSTEM AND METHOD FOR POLICING NETWORK TRAFFIC FLOWS USING A TERNARY CONTENT ADDRESSABLE MEMORY IN A HIGH PERFORMANCE COMPUTING ENVIRONMENT

(71) Applicant: Oracle International Corporation, Redwood Shores, CA (US)

(72) Inventors: Bjørn Dag Johnsen, Oslo (NO); Arvind Srinivasan, San Jose, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 41 days.

(21) Appl. No.: 15/414,227

(22) Filed: Jan. 24, 2017

(65) Prior Publication Data

US 2017/0223105 A1     Aug. 3, 2017

Related U.S. Application Data

(60) Provisional application No. 62/288,101, filed on Jan. 28, 2016.

(51) Int. Cl.
*H04L 12/26*     (2006.01)
*G06F 9/451*     (2018.01)
(Continued)

(52) U.S. Cl.
CPC .......... *H04L 43/0876* (2013.01); *G06F 9/451* (2018.02); *G06F 11/3006* (2013.01);
(Continued)

(58) Field of Classification Search
None
See application file for complete search history.

(56) References Cited

U.S. PATENT DOCUMENTS 6,766,467 B1 *   7/2004   Neal ................... G06F 11/0727
                                                    714/5.11
6,954,459 B1     10/2005   Vaidhyanathan et al.
(Continued)

OTHER PUBLICATIONS

United States Patent and Trademark Office, Office Action dated May 31, 2018 for U.S. Appl. No. 15/416,642, 32 Pages.
(Continued)

*Primary Examiner* — Esther B. Henderson
(74) *Attorney, Agent, or Firm* — Tucker Ellis LLP

(57) ABSTRACT

System and method for policing logical network traffic flows using a ternary content addressable memory (TCAM). An exemplary embodiment can provide a network port that is associated with a plurality of entries of a TCAM, where each TCAM entry contains a value. Further, each TCAM entry can be assigned a priority and associated with at least one allow/drop action. A predefined set of values can be retrieved from at least one header field of a data packet processed by the network port. Each value in the predefined set of values can be aggregated into a search value, and the search value can be compared to the value contained in each TCAM entry. When a match is found between the search value and the value contained in a TCAM entry, the allow/drop action associated with the matching TCAM entry can be performed.

20 Claims, 14 Drawing Sheets

(51) Int. Cl.
- *G06F 11/30* (2006.01)
- *G11C 15/00* (2006.01)
- *H04L 12/813* (2013.01)
- *H04L 29/08* (2006.01)
- *H04L 12/743* (2013.01)
- *H04L 12/947* (2013.01)
- *H04L 12/931* (2013.01)
- *H04L 29/06* (2006.01)
- *H04L 12/911* (2013.01)

(52) U.S. Cl.
CPC .......... *G11C 15/00* (2013.01); *H04L 45/7457* (2013.01); *H04L 47/20* (2013.01); *H04L 47/70* (2013.01); *H04L 49/25* (2013.01); *H04L 49/358* (2013.01); *H04L 67/1097* (2013.01); *H04L 69/22* (2013.01); *G06F 2201/88* (2013.01)

(56) References Cited

U.S. PATENT DOCUMENTS

| | | |
|---|---|---|
| 7,010,607 B1 | 3/2006 | Bunton |
| 7,103,626 B1 | 9/2006 | Recio et al. |
| 7,171,484 B1 | 1/2007 | Krause et al. |
| 7,983,265 B1 | 7/2011 | Dropps |
| 8,949,389 B1 | 2/2015 | Rimmer |
| 9,438,479 B1 | 9/2016 | Friedman et al. |
| 2003/0033426 A1 | 2/2003 | Beukema et al. |
| 2003/0223435 A1 | 12/2003 | Gil |
| 2004/0022245 A1 | 2/2004 | Forbes et al. |
| 2004/0022257 A1 | 2/2004 | Green et al. |
| 2004/0024903 A1 | 2/2004 | Costatino et al. |
| 2004/0100950 A1 | 5/2004 | Basu et al. |
| 2004/0215848 A1 | 10/2004 | Craddock et al. |
| 2005/0071472 A1 | 3/2005 | Arndt et al. |
| 2005/0144313 A1 | 6/2005 | Arndt et al. |
| 2005/0271073 A1 | 12/2005 | Johnsen et al. |
| 2006/0002385 A1 | 1/2006 | Johnsen et al. |
| 2006/0268869 A1 | 11/2006 | Boers et al. |
| 2008/0267183 A1 | 10/2008 | Arndt et al. |
| 2009/0070422 A1 | 3/2009 | Kashyap et al. |
| 2009/0141728 A1 | 6/2009 | Brown et al. |
| 2010/0287548 A1 | 11/2010 | Zhou et al. |
| 2010/0290464 A1 | 11/2010 | Assarpour |
| 2012/0106354 A1* | 5/2012 | Pleshek .................. H04L 43/028 370/241 |
| 2012/0170582 A1* | 7/2012 | Abts .................. H04L 45/06 370/392 |
| 2012/0195308 A1 | 8/2012 | Shiraki |
| 2012/0287933 A1 | 11/2012 | Li et al. |
| 2012/0307682 A1 | 12/2012 | Johnsen et al. |
| 2012/0314706 A1 | 12/2012 | Liss et al. |
| 2013/0054947 A1 | 2/2013 | Gavrilov |
| 2013/0086298 A1 | 4/2013 | Alanis et al. |
| 2013/0254321 A1 | 9/2013 | Johnsen et al. |
| 2013/0254424 A1 | 9/2013 | Guay et al. |
| 2013/0266009 A1 | 10/2013 | Colloff et al. |
| 2013/0301645 A1 | 11/2013 | Bogdanski et al. |
| 2013/0301646 A1 | 11/2013 | Bogdanski et al. |
| 2014/0016645 A1 | 1/2014 | Nomura et al. |
| 2014/0181823 A1* | 6/2014 | Manula .................. G06F 9/546 718/102 |
| 2014/0269720 A1 | 9/2014 | Srinivasan |
| 2014/0317165 A1 | 10/2014 | Pelissier et al. |
| 2015/0023214 A1 | 1/2015 | Soneda et al. |
| 2015/0067191 A1 | 3/2015 | Makhervaks et al. |
| 2015/0098466 A1 | 4/2015 | Haramaty et al. |
| 2015/0113132 A1 | 4/2015 | Srinivas et al. |
| 2015/0180782 A1 | 6/2015 | Rimmer et al. |
| 2015/0295758 A1 | 10/2015 | Melander et al. |
| 2016/0072816 A1 | 3/2016 | Makhervaks et al. |
| 2016/0179582 A1 | 6/2016 | Skerry et al. |
| 2016/0246631 A1 | 8/2016 | Tsirkin |
| 2016/0274926 A1 | 9/2016 | Narasimhamurthy et al. |
| 2016/0337272 A1 | 11/2016 | Berman |
| 2017/0099195 A1 | 4/2017 | Raney |
| 2017/0289016 A1 | 10/2017 | Ficet et al. |
| 2018/0026878 A1 | 1/2018 | Zahavi et al. |

OTHER PUBLICATIONS

United States Patent and Trademark Office, Office Action dated Mar. 29, 2018 for U.S. Appl. No. 15/416,696, 14 Pages.
United States Patent and Trademark Office, Office Action dated Apr. 10, 2018 for U.S. Appl. No. 15/416,709, 23 Pages.
United States Patent and Trademark Office, Office Action dated Sep. 18, 2018 for U.S. Appl. No. 15/414,211, 16 Pages.
United States Patent and Trademark Office, Office Action dated Sep. 27, 2018 for U.S. Appl. No. 15/416,696, 17 Pages.
United States Patent and Trademark Office, Office Action dated Oct. 3, 2018 for U.S. Appl. No. 15/656,856, 20 Pages.
United States Patent and Trademark Office, Office Action dated Oct. 3, 2018 for U.S. Appl. No. 15/656,857, 20 Pages.
United States Patent and Trademark Office, Office Action dated Oct. 4, 2018 for U.S. Appl. No. 15/656,977, 24 Pages.
United States Patent and Trademark Office, Office Action dated Oct. 5, 2018 for U.S. Appl. No. 15/656,981, 31 Pages.
United States Patent and Trademark Office, Notice of Allowance dated Mar. 27, 2019 for U.S. Appl. No. 15/414,211, 18 Pages.
United States Patent and Trademark Office, Office Action dated May 3, 2019 for U.S. Appl. No. 15/656,949, 17 Pages.
United States Patent and Trademark Office, Office Action dated Jun. 3, 2019 for U.S. Appl. No. 15/656,955, 18 Pages.
United States Patent and Trademark Office, Office Action dated Jun. 14, 2019 for U.S. Appl. No. 15/656,951, 18 Pages.
Bogdanski, et al., "Making the Network Scalable: Inter-subnet Routing in InfiniBand", Aug. 26, 2013, pp. 685-698, 14 pages.
International Search Report and the Written Opinion of the International Searching Authority dated Apr. 5, 2017 for PCT Application No. PCT/US2017/015464, 10 pages.
International Search Report and the Written Opinion of the International Searching Authority dated Apr. 11, 2017 for PCT Application No. PCT/US2017/015484, 15 pages.

* cited by examiner

SYSTEM AND METHOD FOR POLICING NETWORK TRAFFIC FLOWS USING A TERNARY CONTENT ADDRESSABLE MEMORY IN A HIGH PERFORMANCE COMPUTING ENVIRONMENT

CLAIM OF PRIORITY AND CROSS REFERENCE TO RELATED APPLICATIONS

This application claims the benefit of priority to U.S. Provisional patent application entitled "SYSTEM AND METHOD FOR USING SUBNET PREFIX VALUES IN GLOBAL ROUTE HEADERS FOR LINEAR FORWARDING TABLE LOOKUP IN A HIGH PERFORMANCE COMPUTING ENVIRONMENT", Application Ser. No. 62/288,101, filed on Jan. 28, 2016, which is incorporated by reference in its entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

This application is related to the following patent application, which is hereby incorporated by reference in its entirety:

U.S. patent application entitled "SYSTEM AND METHOD FOR MONITORING LOGICAL NETWORK TRAFFIC FLOWS USING A TERNARY CONTENT ADDRESSABLE MEMORY IN A HIGH PERFORMANCE COMPUTING ENVIRONMENT", application Ser. No. 15/414,211, filed Jan. 24, 2017.

FIELD OF INVENTION

The present invention is generally related to computer systems, and is particularly related to policing logical network traffic flows using a ternary content addressable memory.

BACKGROUND

As larger cloud computing architectures are introduced, the performance and administrative bottlenecks associated with the traditional network and storage have become a significant problem. There has been an increased interest in using high performance lossless interconnects such as InfiniBand™ (IB) technology as the foundation for a cloud computing fabric. This is the general area that embodiments of the invention are intended to address.

SUMMARY

Described herein are systems and methods for policing logical network traffic flows using a ternary content addressable memory (TCAM). An exemplary embodiment can provide a network port that is associated with a plurality of entries of a TCAM, where each TCAM entry contains a value. Further, each TCAM entry can be assigned a priority and associated with at least one allow/drop action. A predefined set of values can be retrieved from at least one header field of a data packet processed by the network port. Each value in the predefined set of values can be aggregated into a search value, and the search value can be compared to the value contained in each TCAM entry. When a match is found between the search value and the value contained in a TCAM entry, the allow/drop action associated with the matching TCAM entry can be performed.

DETAILED DESCRIPTION

Figure 1:
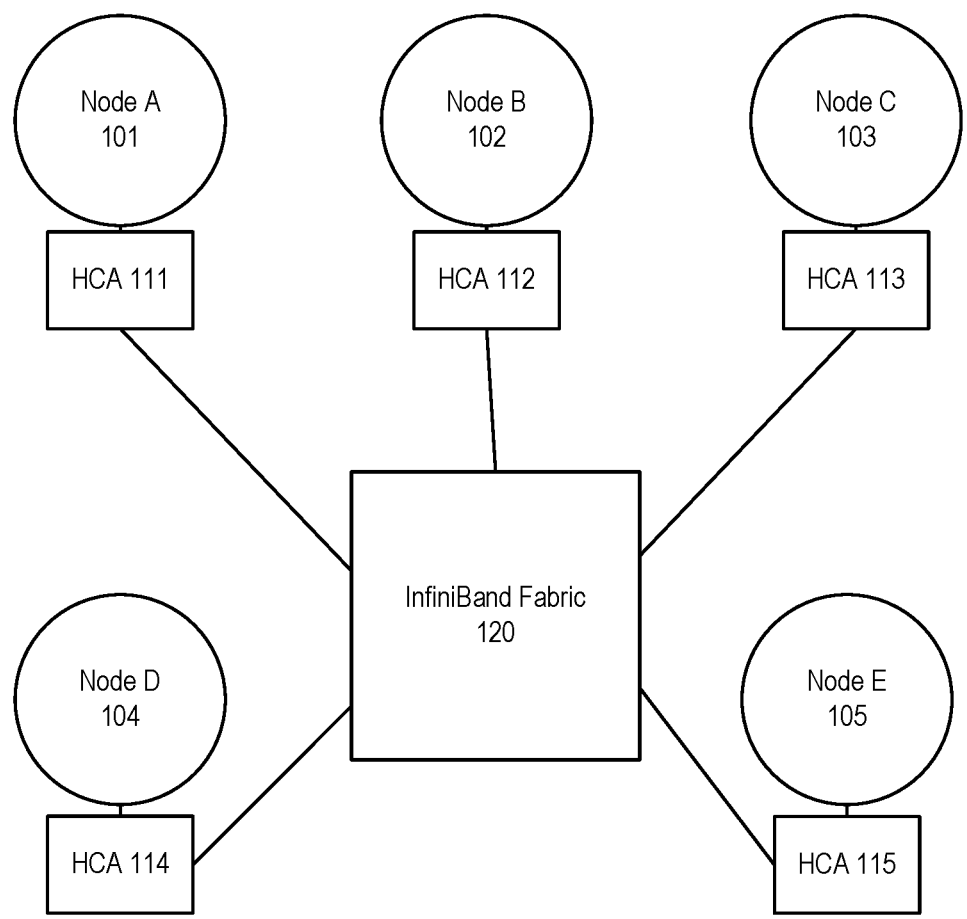
FIG. 1 shows an illustration of an InfiniBand™ environment, in accordance with an embodiment.

The invention is illustrated, by way of example and not by way of limitation, in the figures of the accompanying drawings in which like references indicate similar elements. It should be noted that references to "an" or "one" or "some" embodiment(s) in this disclosure are not necessarily to the same embodiment, and such references mean at least one. While specific implementations are discussed, it is understood that the specific implementations are provided for illustrative purposes only. A person skilled in the relevant art will recognize that other components and configurations may be used without departing from the scope and spirit of the invention.

Common reference numerals can be used to indicate like elements throughout the drawings and detailed description; therefore, reference numerals used in a figure may or may not be referenced in the detailed description specific to such figure if the element is described elsewhere.

Described herein are systems and methods for policing logical network traffic flows using a TCAM.

The following description of the invention uses an InfiniBand™ (IB) network as an example for a high performance network. Throughout the following description, reference can be made to the InfiniBand™ specification (also referred to variously as the InfiniBand specification, IB specification, or the legacy IB specification). Such reference is understood to refer to the InfiniBand® Trade Association Architecture Specification, Volume 1, Version 1.3, released March, 2015, available at http://www.inifinibandta.org, which is herein incorporated by reference in its entirety. It will be apparent to those skilled in the art that other types of high performance networks can be used without limitation. The following description also uses the fat-tree topology as an example for a fabric topology. It will be apparent to those skilled in the art that other types of fabric topologies can be used without limitation.

InfiniBand™

InfiniBand™ (IB) is an open standard lossless network technology developed by the InfiniBand™ Trade Association. The technology is based on a serial point-to-point full-duplex interconnect that offers high throughput and low latency communication, geared particularly towards high-performance computing (HPC) applications and datacenters.

The InfiniBand™ Architecture (IBA) supports a two-layer topological division. At the lower layer, IB networks are referred to as subnets, where a subnet can include a set of hosts interconnected using switches and point-to-point links. At the higher level, an IB fabric constitutes one or more subnets, which can be interconnected using routers.

Within a subnet, hosts can be connected using switches and point-to-point links. Additionally, there can be a master management entity, the subnet manager (SM), which resides on a designated device in the subnet. The subnet manager is responsible for configuring, activating and maintaining the IB subnet. Additionally, the subnet manager (SM) can be responsible for performing routing table calculations in an IB fabric. Here, for example, the routing of the IB network aims at proper load balancing between all source and destination pairs in the local subnet.

Through the subnet management interface, the subnet manager exchanges control packets, which are referred to as subnet management packets (SMPs), with subnet management agents (SMAs). The subnet management agents reside on every IB subnet device. By using SMPs, the subnet manager is able to discover the fabric, configure end-nodes and switches, and receive notifications from SMAs.

In accordance with an embodiment, intra-subnet routing in an IB network can be based on linear forwarding tables (LFTs) stored in the switches. The LFTs are calculated by the SM according to the routing mechanism in use. In a subnet, Host Channel Adapter (HCA) ports on the end nodes and switches are addressed using local identifiers (LIDs). Each entry in a linear forwarding table (LFT) consists of a destination LID (DLID) and an output port. Only one entry per LID in the table is supported. When a packet arrives at a switch, its output port is determined by looking up the DLID in the forwarding table of the switch. The routing is deterministic as packets take the same path in the network between a given source-destination pair (LID pair).

Generally, all other subnet managers, excepting the master subnet manager, act in standby mode for fault-tolerance. In a situation where a master subnet manager fails, however, a new master subnet manager is negotiated by the standby subnet managers. The master subnet manager also performs periodic sweeps of the subnet to detect any topology changes and reconfigures the network accordingly.

Furthermore, hosts and switches within a subnet can be addressed using local identifiers (LIDs), and a single subnet can be limited to 49151 unicast LIDs. Besides the LIDs, which are the local addresses that are valid within a subnet, each IB device can have a 64-bit global unique identifier (GUID). A GUID can be used to form a global identifier (GID), which is an IB layer three (L3) address.

The SM can calculate routing tables (i.e., the connections/routes between each pair of nodes within the subnet) at network initialization time. Furthermore, the routing tables can be updated whenever the topology changes, in order to ensure connectivity and optimal performance. During normal operations, the SM can perform periodic light sweeps of the network to check for topology changes. If a change is discovered during a light sweep or if a message (trap) signaling a network change is received by the SM, the SM can reconfigure the network according to the discovered changes.

For example, the SM can reconfigure the network when the network topology changes, such as when a link goes down, when a device is added, or when a link is removed. The reconfiguration steps can include the steps performed during the network initialization. Furthermore, the reconfigurations can have a local scope that is limited to the subnets in which the network changes occurred. Also, the segmenting of a large fabric with routers may limit the reconfiguration scope.

An example InfiniBand™ fabric is shown in FIG. 1, which shows an illustration of an InfiniBand™ environment 100, in accordance with an embodiment. In the example shown in FIG. 1, nodes A-E, 101-105, use the InfiniBand™ fabric 120 to communicate, via the respective host channel adapters 111-115. In accordance with an embodiment, the various nodes, e.g., nodes A-E 101-105, can be represented by various physical devices. In accordance with an embodiment, the various nodes, e.g., nodes A-E 101-105, can be represented by various virtual devices, such as virtual machines.

Partitioning in InfiniBand™

In accordance with an embodiment, IB networks can support partitioning as a security mechanism to provide for isolation of logical groups of systems sharing a network fabric. Each HCA port on a node in the fabric can be a member of one or more partitions. In accordance with an embodiment, the present disclosure provides for two types of partitions that can be defined within an IB subnet-data partitions (discussed in detail in the following paragraphs) and admin partitions (discussed in detail later in the disclosure).

Data partition memberships are managed by a centralized partition manager, which can be part of the SM. The SM can configure data partition membership information on each port as a table of 16-bit partition keys (P_Keys). The SM can also configure switch and router ports with the data partition enforcement tables containing P_Key information associated with the end-nodes that send or receive data traffic through these ports. Additionally, in a general case, data partition membership of a switch port can represent a union of all membership indirectly associated with LIDs routed via the port in an egress (towards the link) direction.

In accordance with an embodiment, data partitions are logical groups of ports such that the members of a group can only communicate to other members of the same logical group. At host channel adapters (HCAs) and switches, packets can be filtered using the data partition membership information to enforce isolation. Packets with invalid partitioning information can be dropped as soon as the packets reaches an incoming port. In partitioned IB systems, data partitions can be used to create tenant clusters. With data partition enforcement in place, a node cannot communicate with other nodes that belong to a different tenant cluster. In this way, the security of the system can be guaranteed even in the presence of compromised or malicious tenant nodes.

In accordance with an embodiment, for the communication between nodes, Queue Pairs (QPs) and End-to-End contexts (EECs) can be assigned to a particular data partition, except for the management Queue Pairs (QP0 and QP1). The P_Key information can then be added to every IB transport packet sent. When a packet arrives at an HCA port or a switch, its P_Key value can be validated against a table configured by the SM. If an invalid P_Key value is found, the packet is discarded immediately. In this way, communication is allowed only between ports sharing a data partition.

Figure 2:
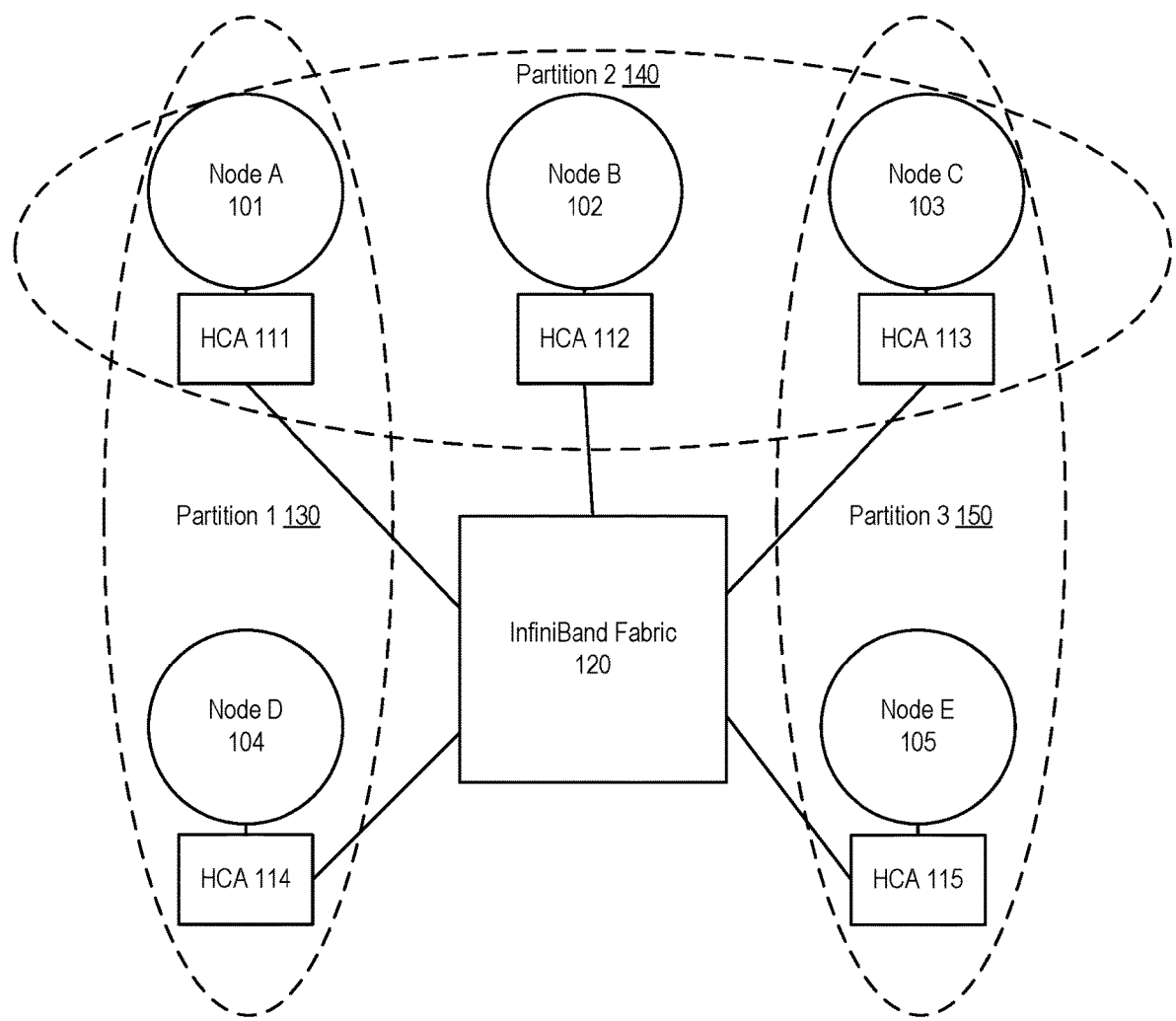
FIG. 2 shows an illustration of a partitioned cluster environment, in accordance with an embodiment

An example of IB data partitions is shown in FIG. 2, which shows an illustration of a data partitioned cluster environment, in accordance with an embodiment. In the example shown in FIG. 2, nodes A-E, 101-105, use the InfiniBand™ fabric, 120, to communicate, via the respective host channel adapters 111-115. The nodes A-E are arranged into data partitions, namely data partition 1, 130, data partition 2, 140, and data partition 3, 150. Data partition 1 comprises node A 101 and node D 104. Data partition 2 comprises node A 101, node B 102, and node C 103. Data partition 3 comprises node C 103 and node E 105. Because of the arrangement of the data partitions, node D 104 and node E 105 are not allowed to communicate as these nodes do not share a data partition. Meanwhile, for example, node A 101 and node C 103 are allowed to communicate as these nodes are both members of data partition 2, 140.

Virtual Machines in InfiniBand™

During the last decade, the prospect of virtualized High Performance Computing (HPC) environments has improved considerably as CPU overhead has been practically removed through hardware virtualization support; memory overhead has been significantly reduced by virtualizing the Memory Management Unit; storage overhead has been reduced by the use of fast SAN storages or distributed networked file systems; and network I/O overhead has been reduced by the use of device passthrough techniques like Single Root Input/Output Virtualization (SR-IOV). It is now possible for clouds to accommodate virtual HPC (vHPC) clusters using high performance interconnect solutions and deliver the necessary performance.

However, when coupled with lossless networks, such as InfiniBand™ (IB), certain cloud functionality, such as live migration of virtual machines (VMs), still remains an issue due to the complicated addressing and routing schemes used in these solutions. IB is an interconnection network technology offering high bandwidth and low latency, thus, is very well suited for HPC and other communication intensive workloads.

The traditional approach for connecting IB devices to VMs is by utilizing SR-IOV with direct assignment. However, achieving live migration of VMs assigned with IB Host Channel Adapters (HCAs) using SR-IOV has proved to be challenging. Each IB connected node has three different addresses: LID, GUID, and GID. When a live migration happens, one or more of these addresses change. Other nodes communicating with the VM-in-migration can lose connectivity. When this happens, the lost connection can be attempted to be renewed by locating the virtual machine's new address to reconnect to by sending Subnet Administration (SA) path record queries to the IB Subnet Manager (SM).

IB uses three different types of addresses. A first type of address is the 16 bits Local Identifier (LID). At least one unique LID is assigned to each HCA port and each switch by the SM. The LIDs are used to route traffic within a subnet. Since the LID is 16 bits long, 65536 unique address combinations can be made, of which only 49151 (0x0001-0xBFFF) can be used as unicast addresses. Consequently, the number of available unicast addresses defines the maximum size of an IB subnet. A second type of address is the 64 bits Global Unique Identifier (GUID) assigned by the manufacturer to each device (e.g. HCAs and switches) and each HCA port. The SM may assign additional subnet unique GUIDs to an HCA port, which is useful when SR-IOV is used. A third type of address is the 128 bits Global Identifier (GID). The GID is a valid IPv6 unicast address, and at least one is assigned to each HCA port. The GID is formed by combining a globally unique 64 bits prefix assigned by the fabric administrator, and the GUID address of each HCA port.

Fat-Tree (FTree) Topologies and Routing

In accordance with an embodiment, some of the IB based HPC systems employ a fat-tree topology to take advantage of the useful properties fat-trees offer. These properties include full bisection-bandwidth and inherent fault-tolerance due to the availability of multiple paths between each source destination pair. The initial idea behind fat-trees was to employ fatter links between nodes, with more available bandwidth, as the tree moves towards the roots of the topology. The fatter links can help to avoid congestion in the upper-level switches and the bisection-bandwidth is maintained.

Figure 3:
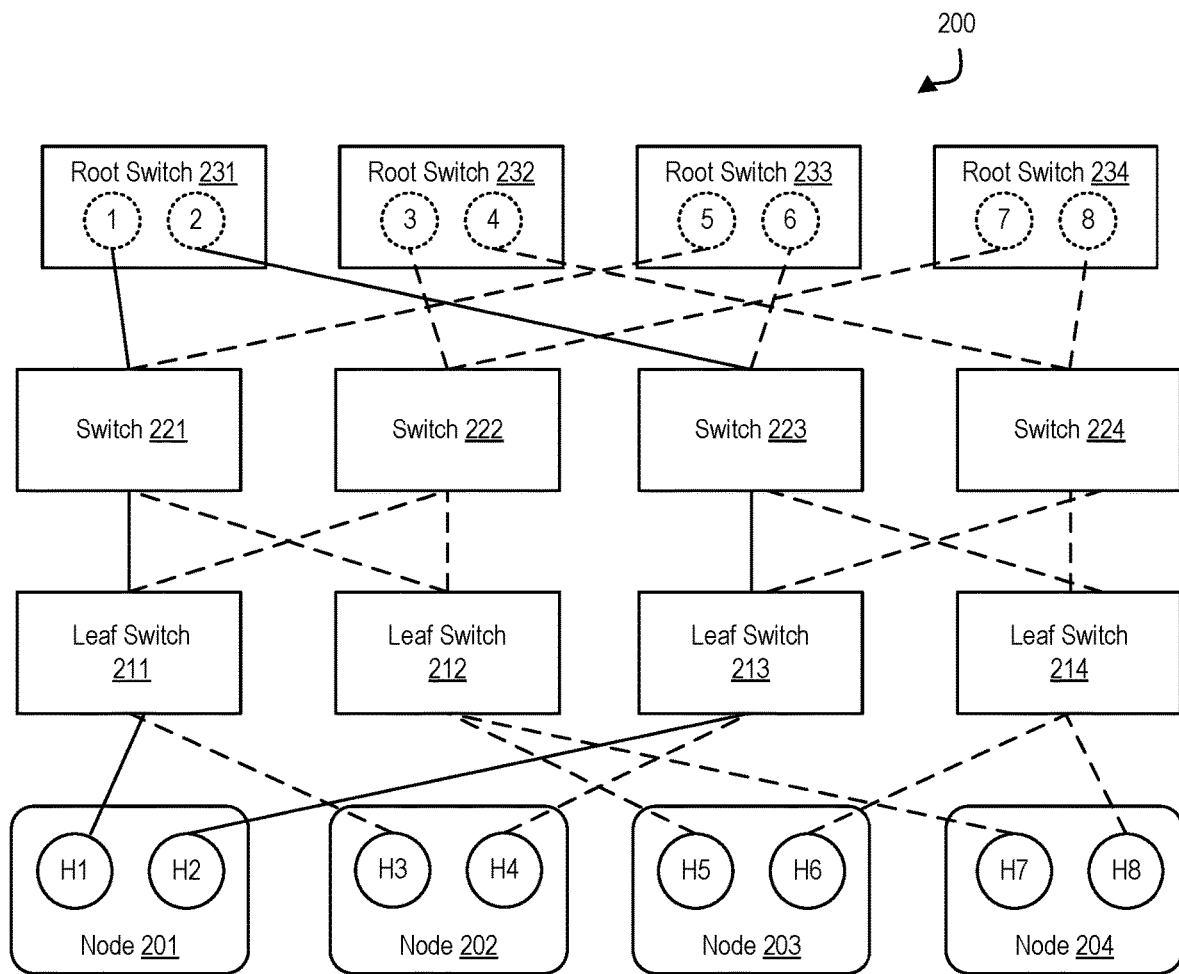
FIG. 3 shows an illustration of a tree topology in a network environment, in accordance with an embodiment.

FIG. 3 shows an illustration of a tree topology in a network environment, in accordance with an embodiment. As shown in FIG. 3, one or more end-nodes 201-204 can be connected in a network fabric 200. The network fabric 200 can be based on a fat-tree topology, which includes a plurality of leaf switches 211-214, and multiple spine switches or root switches 231-234. Additionally, the network fabric 200 can include one or more intermediate switches, such as switches 221-224.

Also as shown in FIG. 3, each of the end-nodes 201-204 can be a multi-homed node, i.e., a single node that is connected to two or more parts of the network fabric 200 through multiple ports. For example, the node 201 can include the ports H1 and H2, the node 202 can include the ports H3 and H4, the node 203 can include the ports H5 and H6, and the node 204 can include the ports H7 and H8.

Additionally, each switch can have multiple switch ports. For example, the root switch 231 can have the switch ports 1-2, the root switch 232 can have the switch ports 3-4, the root switch 233 can have the switch ports 5-6, and the root switch 234 can have the switch ports 7-8.

In accordance with an embodiment, the fat-tree routing mechanism is one of the most popular routing algorithm for IB based fat-tree topologies. The fat-tree routing mechanism is also implemented in the OFED (Open Fabric Enterprise Distribution—a standard software stack for building and deploying IB based applications) subnet manager, OpenSM.

The fat-tree routing mechanism aims to generate LFTs that evenly spread shortest-path routes across the links in the network fabric. The mechanism traverses the fabric in the indexing order and assigns target LIDs of the end-nodes, and thus the corresponding routes, to each switch port. For the end-nodes connected to the same leaf switch, the indexing order can depend on the switch port to which the end-node is connected (i.e., port numbering sequence). For each port, the mechanism can maintain a port usage counter, and can use this port usage counter to select a least-used port each time a new route is added.

In accordance with an embodiment, in a partitioned subnet, nodes that are not members of a common data partition are not allowed to communicate. Practically, this means that some of the routes assigned by the fat-tree routing algorithm are not used for the user traffic. The problem arises when the fat tree routing mechanism generates LFTs for those routes the same way it does for the other functional paths. This behavior can result in degraded balancing on the links, as nodes are routed in the order of indexing. As routing can be performed oblivious to the data partitions, fat-tree routed subnets, in general, provide poor isolation among data partitions.

In accordance with an embodiment, a Fat-Tree is a hierarchical network topology that can scale with the available network resources. Moreover, Fat-Trees are easy to build using commodity switches placed on different levels of the hierarchy. Different variations of Fat-Trees are commonly available, including k-ary-n-trees, Extended Generalized Fat-Trees (XGFTs), Parallel Ports Generalized Fat-Trees (PGFTs) and Real Life Fat-Trees (RLFTs).

A k-ary-n-tree is an n level Fat-Tree with $k^n$ end-nodes and $n \cdot k^{n-1}$ switches, each with 2 k ports. Each switch has an equal number of up and down connections in the tree. XGFT Fat-Tree extends k-ary-n-trees by allowing both different number of up and down connections for the switches, and different number of connections at each level in the tree. The PGFT definition further broadens the XGFT topologies and permits multiple connections between switches. A large variety of topologies can be defined using XGFTs and PGFTs. However, for practical purposes, RLFT, which is a restricted version of PGFT, is introduced to define Fat-Trees commonly found in today's HPC clusters. An RLFT uses the same port-count switches at all levels in the Fat-Tree.

Input/Output (I/O) Virtualization

In accordance with an embodiment, I/O Virtualization (IOV) can provide availability of I/O by allowing virtual machines (VMs) to access the underlying physical resources. The combination of storage traffic and inter-server communication impose an increased load that may overwhelm the I/O resources of a single server, leading to backlogs and idle processors as they are waiting for data. With the increase in number of I/O requests, IOV can provide availability; and can improve performance, scalability and flexibility of the (virtualized) I/O resources to match the level of performance seen in modern CPU virtualization.

In accordance with an embodiment, IOV is desired as it can allow sharing of I/O resources and provide protected access to the resources from the VMs. IOV decouples a logical device, which is exposed to a VM, from its physical implementation. Currently, there can be different types of IOV technologies, such as emulation, paravirtualization, direct assignment (DA), and single root-I/O virtualization (SR-IOV).

In accordance with an embodiment, one type of IOV technology is software emulation. Software emulation can allow for a decoupled front-end/back-end software architecture. The front-end can be a device driver placed in the VM, communicating with the back-end implemented by a hypervisor to provide I/O access. The physical device sharing ratio is high and live migrations of VMs are possible with just a few milliseconds of network downtime. However, software emulation introduces additional, undesired computational overhead.

In accordance with an embodiment, another type of IOV technology is direct device assignment. Direct device assignment involves a coupling of I/O devices to VMs, with no device sharing between VMs. Direct assignment, or device passthrough, provides near to native performance with minimum overhead. The physical device bypasses the hypervisor and is directly attached to the VM. However, a downside of such direct device assignment is limited scalability, as there is no sharing among virtual machines—one physical network card is coupled with one VM.

In accordance with an embodiment, Single Root IOV (SR-IOV) can allow a physical device to appear through hardware virtualization as multiple independent lightweight instances of the same device. These instances can be assigned to VMs as passthrough devices, and accessed as Virtual Functions (VFs). The hypervisor accesses the device through a unique (per device), fully featured Physical Function (PF). SR-IOV eases the scalability issue of pure direct assignment. However, a problem presented by SR-IOV is that it can impair VM migration. Among these IOV technologies, SR-IOV can extend the PCI Express (PCIe) specification with the means to allow direct access to a single physical device from multiple VMs while maintaining near to native performance. Thus, SR-IOV can provide good performance and scalability.

SR-IOV allows a PCIe device to expose multiple virtual devices that can be shared between multiple guests by allocating one virtual device to each guest. Each SR-IOV device has at least one physical function (PF) and one or more associated virtual functions (VF). A PF is a normal PCIe function controlled by the virtual machine monitor (VMM), or hypervisor, whereas a VF is a light-weight PCIe function. Each VF has its own base address (BAR) and is assigned with a unique requester ID that enables I/O memory management unit (IOMMU) to differentiate between the traffic streams to/from different VFs. The IOMMU also apply memory and interrupt translations between the PF and the VFs.

Unfortunately, however, direct device assignment techniques pose a barrier for cloud providers in situations where transparent live migration of virtual machines is desired for data center optimization. The essence of live migration is that the memory contents of a VM are copied to a remote hypervisor. Then the VM is paused at the source hypervisor, and the VM's operation is resumed at the destination. When using software emulation methods, the network interfaces are virtual so their internal states are stored into the memory and get copied as well. Thus the downtime could be brought down to a few milliseconds.

However, migration becomes more difficult when direct device assignment techniques, such as SR-IOV, are used. In such situations, a complete internal state of the network interface cannot be copied as it is tied to the hardware. The SR-IOV VFs assigned to a VM are instead detached, the live migration will run, and a new VF will be attached at the destination. In the case of InfiniBand™ and SR-IOV, this process can introduce downtime in the order of seconds. Moreover, in an SR-IOV shared port model the addresses of the VM will change after the migration, causing additional overhead in the SM and a negative impact on the performance of the underlying network fabric.

InfiniBand™ SR-IOV Architecture—Shared Port

There can be different types of SR-IOV models, e.g. a shared port model, a virtual switch model, and a virtual port model.

Figure 4:
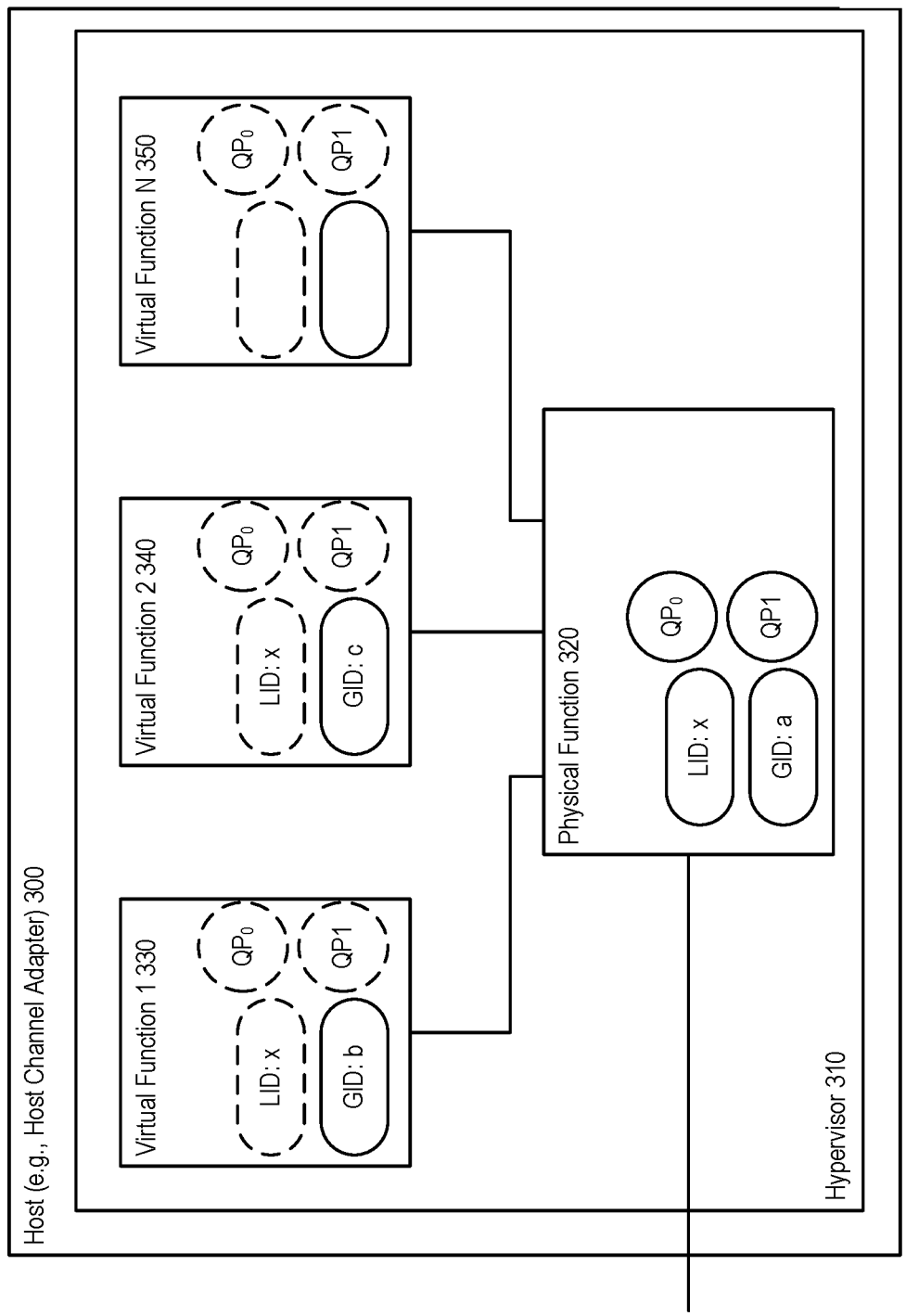
FIG. 4 shows an exemplary shared port architecture, in accordance with an embodiment.

FIG. 4 shows an exemplary shared port architecture, in accordance with an embodiment. As depicted in the figure, a host 300 (e.g., a host channel adapter) can interact with a hypervisor 310, which can assign the various virtual functions 330, 340, 350, to a number of virtual machines. As well, the physical function can be handled by the hypervisor 310.

In accordance with an embodiment, when using a shared port architecture, such as that depicted in FIG. 4, the host, e.g., HCA, appears as a single port in the network with a single shared LID and shared Queue Pair (QP) space between the physical function 320 and the virtual functions 330, 350, 350. However, each function (i.e., physical function and virtual functions) can have their own GID.

As shown in FIG. 4, in accordance with an embodiment, different GIDs can be assigned to the virtual functions and the physical function, and the special queue pairs, QP0 and QP1 (i.e., special purpose queue pairs that are used for InfiniBand™ management packets), are owned by the physical function. These QPs are exposed to the VFs as well, but the VFs are not allowed to use QP0 (all SMPs coming from VFs towards QP0 are discarded), and QP1 can act as a proxy of the actual QP1 owned by the PF.

In accordance with an embodiment, the shared port architecture can allow for highly scalable data centers that are not limited by the number of VMs (which attach to the network by being assigned to the virtual functions), as the LID space is only consumed by physical machines and switches in the network.

However, a shortcoming of the shared port architecture is the inability to provide transparent live migration, hindering the potential for flexible VM placement. As each LID is associated with a specific hypervisor, and shared among all VMs residing on the hypervisor, a migrating VM (i.e., a virtual machine migrating to a destination hypervisor) has to have its LID changed to the LID of the destination hypervisor. Furthermore, as a consequence of the restricted QP0 access, a subnet manager cannot run inside a VM.

InfiniBand™ SR-IOV Architecture Models—Virtual Switch (vSwitch)

Figure 5:
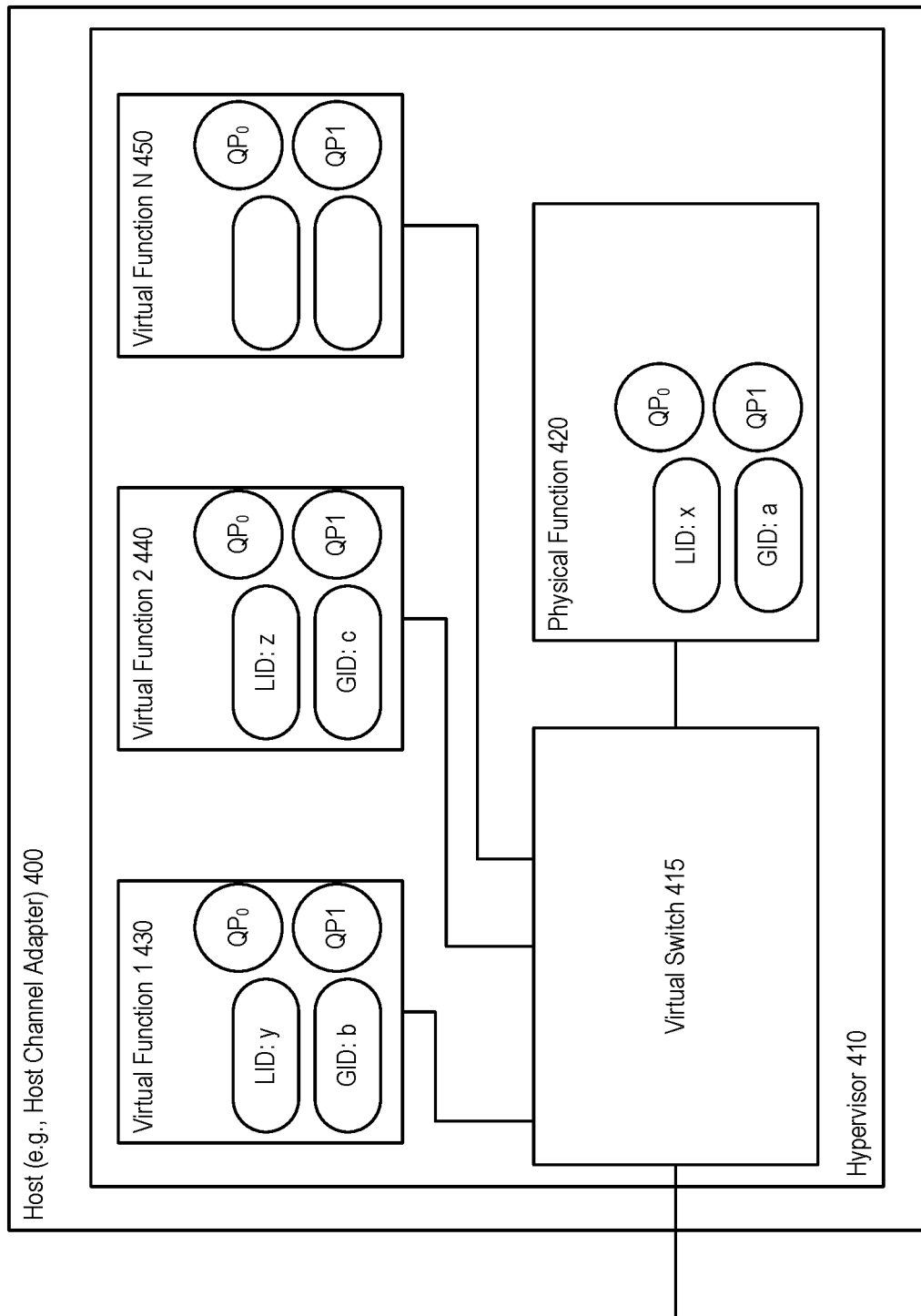
FIG. 5 shows an exemplary vSwitch architecture, in accordance with an embodiment.

FIG. 5 shows an exemplary vSwitch architecture, in accordance with an embodiment. As depicted in the figure, a host 400 (e.g., a host channel adapter) can interact with a hypervisor 410, which can assign the various virtual functions 430, 440, 450, to a number of virtual machines. As well, the physical function can be handled by the hypervisor 410. A virtual switch 415 can also be handled by the hypervisor 401.

In accordance with an embodiment, in a vSwitch architecture each virtual function 430, 440, 450 is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM, the HCA 400 looks like a switch, via the virtual switch 415, with additional nodes connected to it. The hypervisor 410 can use the PF 420, and the VMs (attached to the virtual functions) use the VFs.

In accordance with an embodiment, a vSwitch architecture provide transparent virtualization. However, because each virtual function is assigned a unique LID, the number of available LIDs gets consumed rapidly. As well, with many LID addresses in use (i.e., one each for each physical function and each virtual function), more communication paths have to be computed by the SM and more Subnet Management Packets (SMPs) have to be sent to the switches in order to update their LFTs. For example, the computation of the communication paths might take several minutes in large networks. Because LID space is limited to 49151 unicast LIDs, and as each VM (via a VF), physical node, and switch occupies one LID each, the number of physical nodes and switches in the network limits the number of active VMs, and vice versa.

InfiniBand™ SR-IOV Architecture Models—Virtual Port (vPort)

Figure 6:
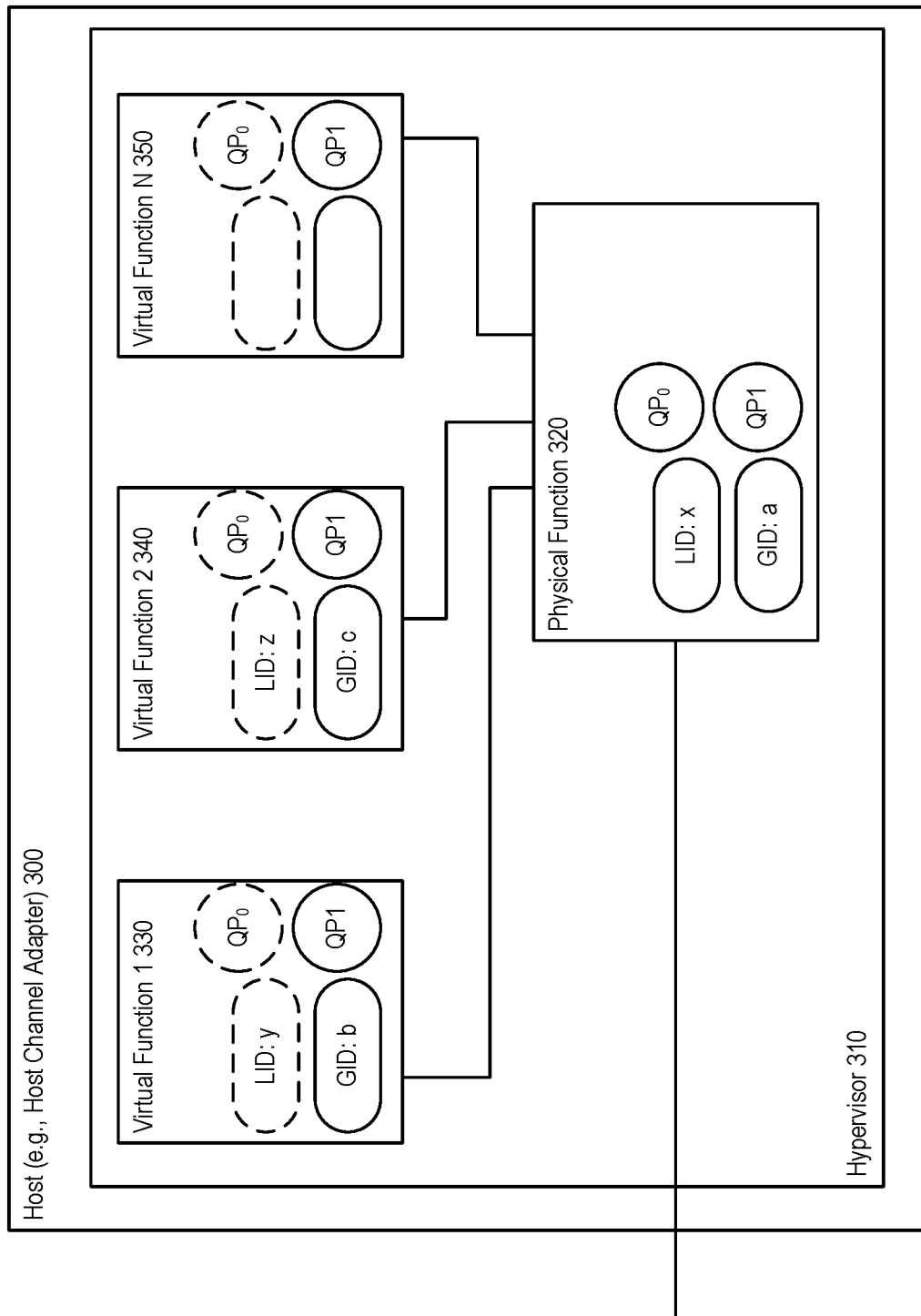
FIG. 6 shows an exemplary vPort architecture, in accordance with an embodiment.

FIG. 6 shows an exemplary vPort concept, in accordance with an embodiment. As depicted in the figure, a host 300 (e.g., a host channel adapter) can interact with a hypervisor 410, which can assign the various virtual functions 330, 340, 350, to a number of virtual machines. As well, the physical function can be handled by the hypervisor 310.

In accordance with an embodiment, the vPort concept is loosely defined in order to give freedom of implementation to vendors (e.g. the definition does not rule that the implementation has to be SRIOV specific), and a goal of the vPort is to standardize the way VMs are handled in subnets. With the vPort concept, both SR-IOV Shared-Port-like and vSwitch-like architectures or a combination of both, that can be more scalable in both the space and performance domains, can be defined. A vPort supports optional LIDs, and unlike the Shared-Port, the SM is aware of all the vPorts available in a subnet even if a vPort is not using a dedicated LID.

InfiniBand™ SR-IOV Architecture Models-vSwitch with Prepopulated LIDs

In accordance with an embodiment, the present disclosure provides a system and method for providing a vSwitch architecture with prepopulated LIDs.

Figure 7:
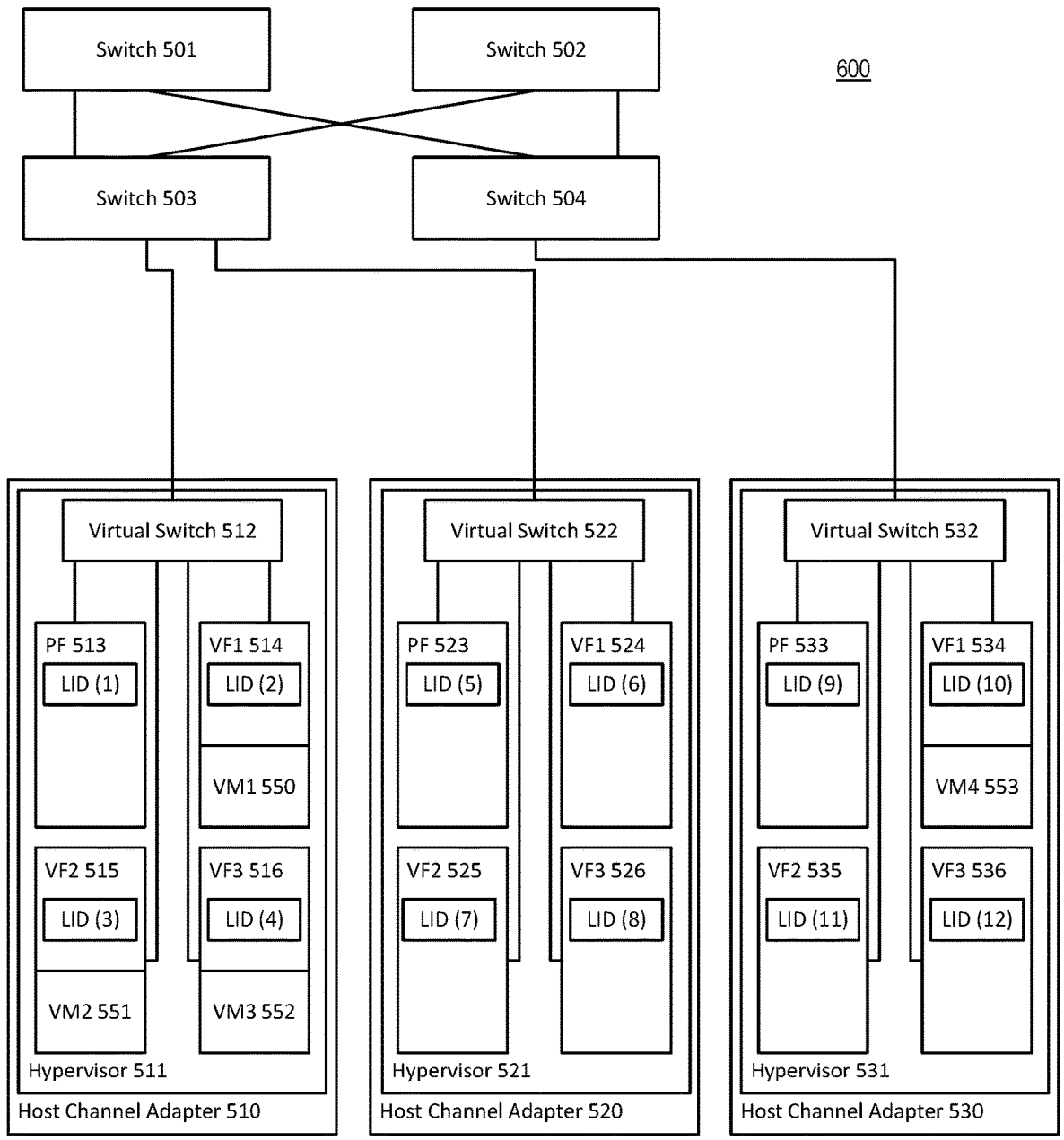
FIG. 7 shows an exemplary vSwitch architecture with prepopulated LIDs, in accordance with an embodiment.

FIG. 7 shows an exemplary vSwitch architecture with prepopulated LIDs, in accordance with an embodiment. As depicted in the figure, a number of switches 501-504 can provide communication within the network switched environment 600 (e.g., an IB subnet) between members of a fabric, such as an InfiniBand™ fabric. The fabric can include a number of hardware devices, such as host channel adapters 510, 520, 530. Each of the host channel adapters 510, 520, 530, can in turn interact with a hypervisor 511, 521, and 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515, and virtual machine 3 552 to virtual function 3 516. Hypervisor 531 can, in turn, assign virtual machine 4 553 to virtual function 1 534. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 600.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a vSwitch architecture with prepopulated LIDs. Referring to FIG. 7, the LIDs are prepopulated to the various physical functions 513, 523, 533, as well as the virtual functions 514-516, 524-526, 534-536 (even those virtual functions not currently associated with an active virtual machine). For example, physical function 513 is prepopulated with LID 1, while virtual function 1 534 is prepopulated with LID 10. The LIDs are prepopulated in an SR-IOV vSwitch-enabled subnet when the network is booted. Even when not all of the VFs are occupied by VMs in the network, the populated VFs are assigned with a LID as shown in FIG. 7.

In accordance with an embodiment, much like physical host channel adapters can have more than one port (two ports are common for redundancy), virtual HCAs can also be represented with two ports and be connected via one, two or more virtual switches to the external IB subnet.

In accordance with an embodiment, in a vSwitch architecture with prepopulated LIDs, each hypervisor can consume one LID for itself through the PF and one more LID for each additional VF. The sum of all the VFs available in all hypervisors in an IB subnet, gives the maximum amount of VMs that are allowed to run in the subnet. For example, in an IB subnet with 16 virtual functions per hypervisor in the subnet, then each hypervisor consumes 17 LIDs (one LID for each of the 16 virtual functions plus one LID for the physical function) in the subnet. In such an IB subnet, the theoretical hypervisor limit for a single subnet is ruled by the number of available unicast LIDs and is: 2891 (49151 available LIDs divided by 17 LIDs per hypervisor), and the total number of VMs (i.e., the limit) is 46256 (2891 hypervisors times 16 VFs per hypervisor). (In actuality, these numbers are smaller since each switch, router, or dedicated SM node in the IB subnet consumes a LID as well). Note that the vSwitch does not need to occupy an additional LID as it can share the LID with the PF.

In accordance with an embodiment, in a vSwitch architecture with prepopulated LIDs, communication paths are computed for all the LIDs the first time the network is booted. When a new VM needs to be started the system does not have to add a new LID in the subnet, an action that would otherwise cause a complete reconfiguration of the network, including path recalculation, which is the most time consuming part. Instead, an available port for a VM is located (i.e., an available virtual function) in one of the hypervisors and the virtual machine is attached to the available virtual function.

In accordance with an embodiment, a vSwitch architecture with prepopulated LIDs also allows for the ability to calculate and use different paths to reach different VMs hosted by the same hypervisor. Essentially, this allows for such subnets and networks to use a LID Mask Control (LMC) like feature to provide alternative paths towards one physical machine, without being bound by the limitation of the LMC that requires the LIDs to be sequential. The freedom to use non-sequential LIDs is particularly useful when a VM needs to be migrated and carry its associated LID to the destination.

In accordance with an embodiment, along with the benefits shown above of a vSwitch architecture with prepopulated LIDs, certain considerations can be taken into account. For example, because the LIDs are prepopulated in an SR-IOV vSwitch-enabled subnet when the network is booted, the initial path computation (e.g., on boot-up) can take longer than if the LIDs were not pre-populated.

InfiniBand™ SR-IOV Architecture Models—vSwitch with Dynamic LID Assignment

In accordance with an embodiment, the present disclosure provides a system and method for providing a vSwitch architecture with dynamic LID assignment.

Figure 8:
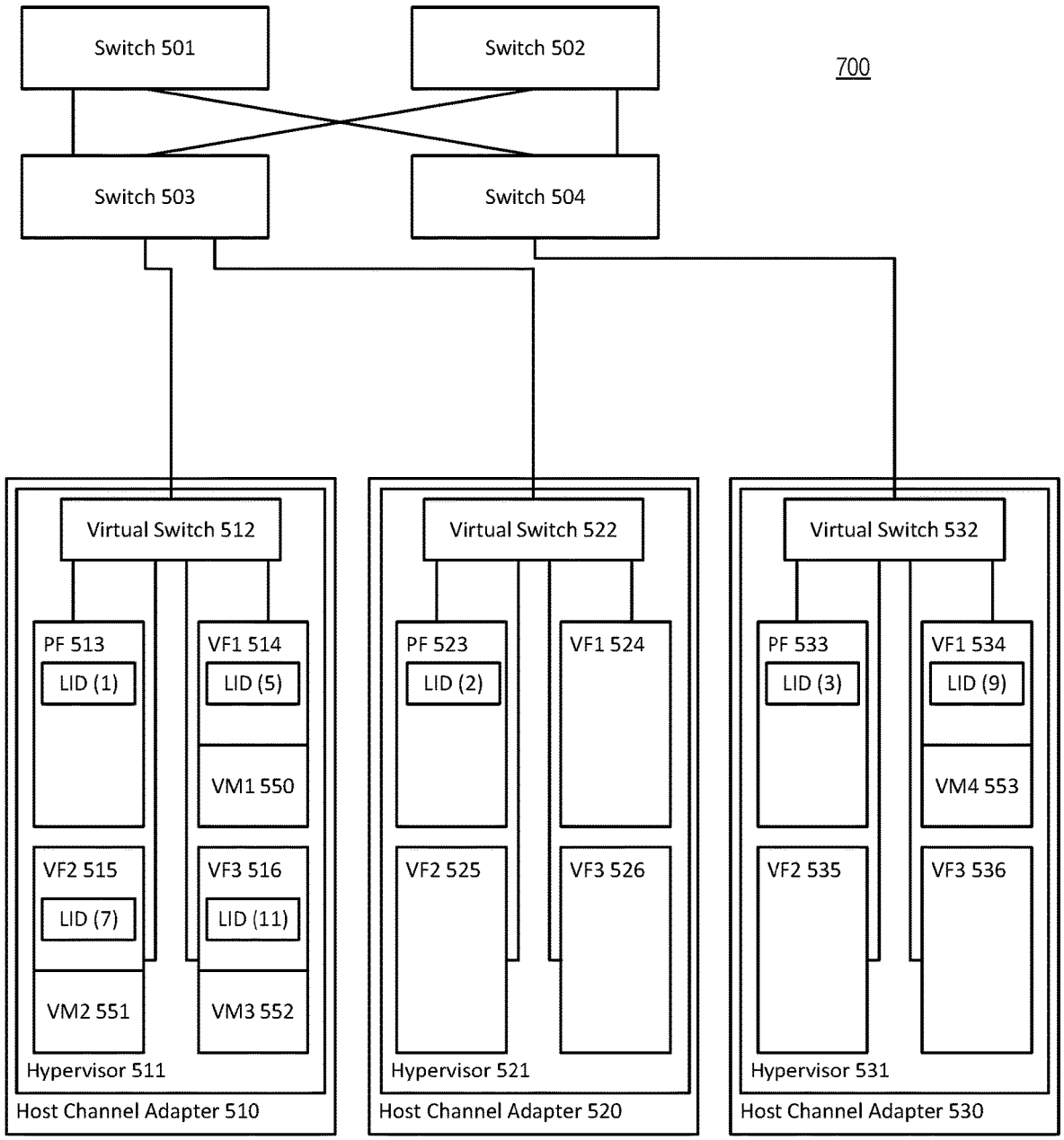
FIG. 8 shows an exemplary vSwitch architecture with dynamic LID assignment, in accordance with an embodiment.

FIG. 8 shows an exemplary vSwitch architecture with dynamic LID assignment, in accordance with an embodiment. As depicted in the figure, a number of switches 501-504 can provide communication within the network switched environment 700 (e.g., an IB subnet) between members of a fabric, such as an InfiniBand™ fabric. The fabric can include a number of hardware devices, such as host channel adapters 510, 520, 530. Each of the host channel adapters 510, 520, 530, can in turn interact with a hypervisor 511, 521, 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515, and virtual machine 3 552 to virtual function 3 516. Hypervisor 531 can, in turn, assign virtual machine 4 553 to virtual function 1 534. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 700.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a vSwitch architecture with dynamic LID assignment. Referring to FIG. 8, the LIDs are dynamically assigned to the various physical functions 513, 523, 533, with physical function 513 receiving LID 1, physical function 523 receiving LID 2, and physical function 533 receiving LID 3. Those virtual functions that are associated with an active virtual machine can also receive a dynamically assigned LID. For example, because virtual machine 1 550 is active and associated with virtual function 1 514, virtual function 514 can be assigned LID 5. Likewise, virtual function 2 515, virtual function 3 516, and virtual function 1 534 are each associated with an active virtual function. Because of this, these virtual functions are assigned LIDs, with LID 7 being assigned to virtual function 2 515, LID 11 being assigned to virtual function 3 516, and LID 9 being assigned to virtual function 1 534. Unlike vSwitch with prepopulated LIDs, those virtual functions not currently associated with an active virtual machine do not receive a LID assignment.

In accordance with an embodiment, with the dynamic LID assignment, the initial path computation can be substantially reduced. When the network is booting for the first time and no VMs are present then a relatively small number of LIDs can be used for the initial path calculation and LFT distribution.

In accordance with an embodiment, much like physical host channel adapters can have more than one port (two ports are common for redundancy), virtual HCAs can also be represented with two ports and be connected via one, two or more virtual switches to the external IB subnet.

In accordance with an embodiment, when a new VM is created in a system utilizing vSwitch with dynamic LID assignment, a free VM slot is found in order to decide on which hypervisor to boot the newly added VM, and a unique non-used unicast LID is found as well. However, there are no known paths in the network and the LFTs of the switches for handling the newly added LID. Computing a new set of paths in order to handle the newly added VM is not desirable in a dynamic environment where several VMs may be booted every minute. In large IB subnets, computing a new set of routes can take several minutes, and this procedure would have to repeat each time a new VM is booted.

Advantageously, in accordance with an embodiment, because all the VFs in a hypervisor share the same uplink with the PF, there is no need to compute a new set of routes. It is only needed to iterate through the LFTs of all the physical switches in the network, copy the forwarding port from the LID entry that belongs to the PF of the hypervisor—where the VM is created—to the newly added LID, and send a single SMP to update the corresponding LFT block of the particular switch. Thus the system and method avoids the need to compute a new set of routes.

In accordance with an embodiment, the LIDs assigned in the vSwitch with dynamic LID assignment architecture do not have to be sequential. When comparing the LIDs assigned on VMs on each hypervisor in vSwitch with prepopulated LIDs versus vSwitch with dynamic LID assignment, it is notable that the LIDs assigned in the dynamic LID assignment architecture are non-sequential, while those prepopulated in are sequential in nature. In the vSwitch dynamic LID assignment architecture, when a new VM is created, the next available LID is used throughout the lifetime of the VM. Conversely, in a vSwitch with prepopulated LIDs, each VM inherits the LID that is already assigned to the corresponding VF, and in a network without live migrations, VMs consecutively attached to a given VF get the same LID.

In accordance with an embodiment, the vSwitch with dynamic LID assignment architecture can resolve the drawbacks of the vSwitch with prepopulated LIDs architecture model at a cost of some additional network and runtime SM overhead. Each time a VM is created, the LFTs of the physical switches in the subnet are updated with the newly added LID associated with the created VM. One subnet management packet (SMP) per switch is needed to be sent for this operation. The LMC-like functionality is also not available, because each VM is using the same path as its host hypervisor. However, there is no limitation on the total amount of VFs present in all hypervisors, and the number of VFs may exceed that of the unicast LID limit. Of course, not all of the VFs are allowed to be attached on active VMs simultaneously if this is the case, but having more spare hypervisors and VFs adds flexibility for disaster recovery and optimization of fragmented networks when operating close to the unicast LID limit.

Figure 9:
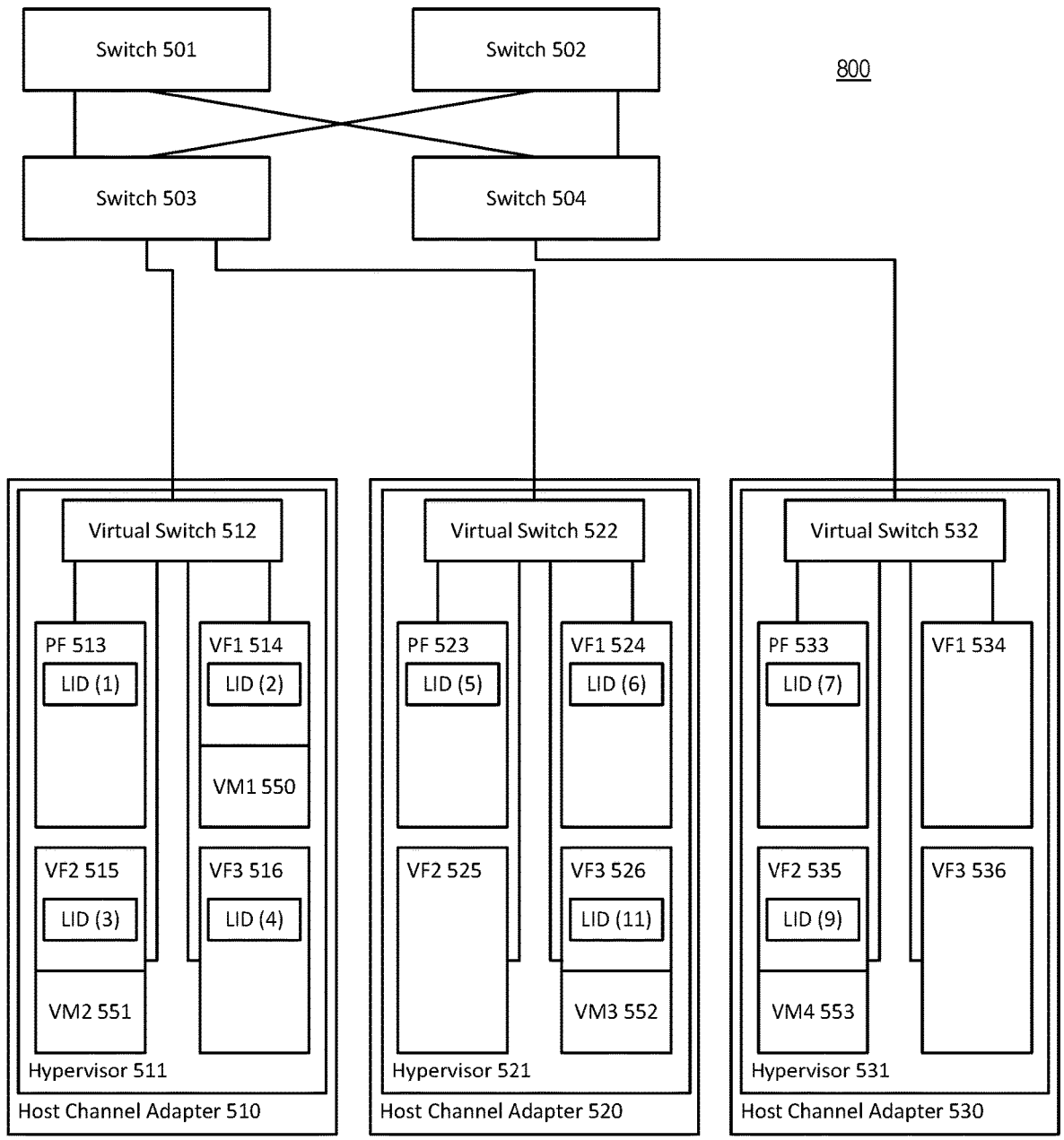
FIG. 9 shows an exemplary vSwitch architecture with vSwitch with dynamic LID assignment and prepopulated LIDs, in accordance with an embodiment.

InfiniBand™ SR-IOV Architecture Models—vSwitch with Dynamic LID Assignment and Prepopulated LIDs FIG. 9 shows an exemplary vSwitch architecture with vSwitch with dynamic LID assignment and prepopulated LIDs, in accordance with an embodiment. As depicted in the figure, a number of switches 501-504 can provide communication within the network switched environment 800 (e.g., an IB subnet) between members of a fabric, such as an InfiniBand™ fabric. The fabric can include a number of hardware devices, such as host channel adapters 510, 520, 530. Each of the host channel adapters 510, 520, 530, can in turn interact with a hypervisor 511, 521, and 531, respectively. Each hypervisor can, in turn, in conjunction with the host channel adapter it interacts with, setup and assign a number of virtual functions 514, 515, 516, 524, 525, 526, 534, 535, 536, to a number of virtual machines. For example, virtual machine 1 550 can be assigned by the hypervisor 511 to virtual function 1 514. Hypervisor 511 can additionally assign virtual machine 2 551 to virtual function 2 515. Hypervisor 521 can assign virtual machine 3 552 to virtual function 3 526. Hypervisor 531 can, in turn, assign virtual machine 4 553 to virtual function 2 535. The hypervisors can access the host channel adapters through a fully featured physical function 513, 523, 533, on each of the host channel adapters.

In accordance with an embodiment, each of the switches 501-504 can comprise a number of ports (not shown), which are used in setting a linear forwarding table in order to direct traffic within the network switched environment 800.

In accordance with an embodiment, the virtual switches 512, 522, and 532, can be handled by their respective hypervisors 511, 521, 531. In such a vSwitch architecture each virtual function is a complete virtual Host Channel Adapter (vHCA), meaning that the VM assigned to a VF is assigned a complete set of IB addresses (e.g., GID, GUID, LID) and a dedicated QP space in the hardware. For the rest of the network and the SM (not shown), the HCAs 510, 520, and 530 look like a switch, via the virtual switches, with additional nodes connected to them.

In accordance with an embodiment, the present disclosure provides a system and method for providing a hybrid vSwitch architecture with dynamic LID assignment and prepopulated LIDs. Referring to FIG. 9, hypervisor 511 can be arranged with vSwitch with prepopulated LIDs architecture, while hypervisor 521 can be arranged with vSwitch with prepopulated LIDs and dynamic LID assignment. Hypervisor 531 can be arranged with vSwitch with dynamic LID assignment. Thus, the physical function 513 and virtual functions 514-516 have their LIDs prepopulated (i.e., even those virtual functions not attached to an active virtual machine are assigned a LID). Physical function 523 and virtual function 1 524 can have their LIDs prepopulated, while virtual function 2 and 3, 525 and 526, have their LIDs dynamically assigned (i.e., virtual function 2 525 is available for dynamic LID assignment, and virtual function 3 526 has a LID of 11 dynamically assigned as virtual machine 3 552 is attached). Finally, the functions (physical function and virtual functions) associated with hypervisor 3 531 can have their LIDs dynamically assigned. This results in virtual functions 1 and 3, 534 and 536, are available for dynamic LID assignment, while virtual function 2 535 has LID of 9 dynamically assigned as virtual machine 4 553 is attached there.

In accordance with an embodiment, such as that depicted in FIG. 9, where both vSwitch with prepopulated LIDs and vSwitch with dynamic LID assignment are utilized (independently or in combination within any given hypervisor), the number of prepopulated LIDs per host channel adapter can be defined by a fabric administrator and can be in the range of 0<=prepopulated VFs<=Total VFs (per host channel adapter), and the VFs available for dynamic LID assignment can be found by subtracting the number of prepopulated VFs from the total number of VFs (per host channel adapter).

In accordance with an embodiment, much like physical host channel adapters can have more than one port (two ports are common for redundancy), virtual HCAs can also be represented with two ports and be connected via one, two or more virtual switches to the external IB subnet.

InfiniBand™—Inter-Subnet Communication

In accordance with an embodiment, in addition to providing an InfiniBand™ fabric within a single subnet, embodiments of the current disclosure can also provide for an InfiniBand™ fabric that spans two or more subnets.

Figure 10:
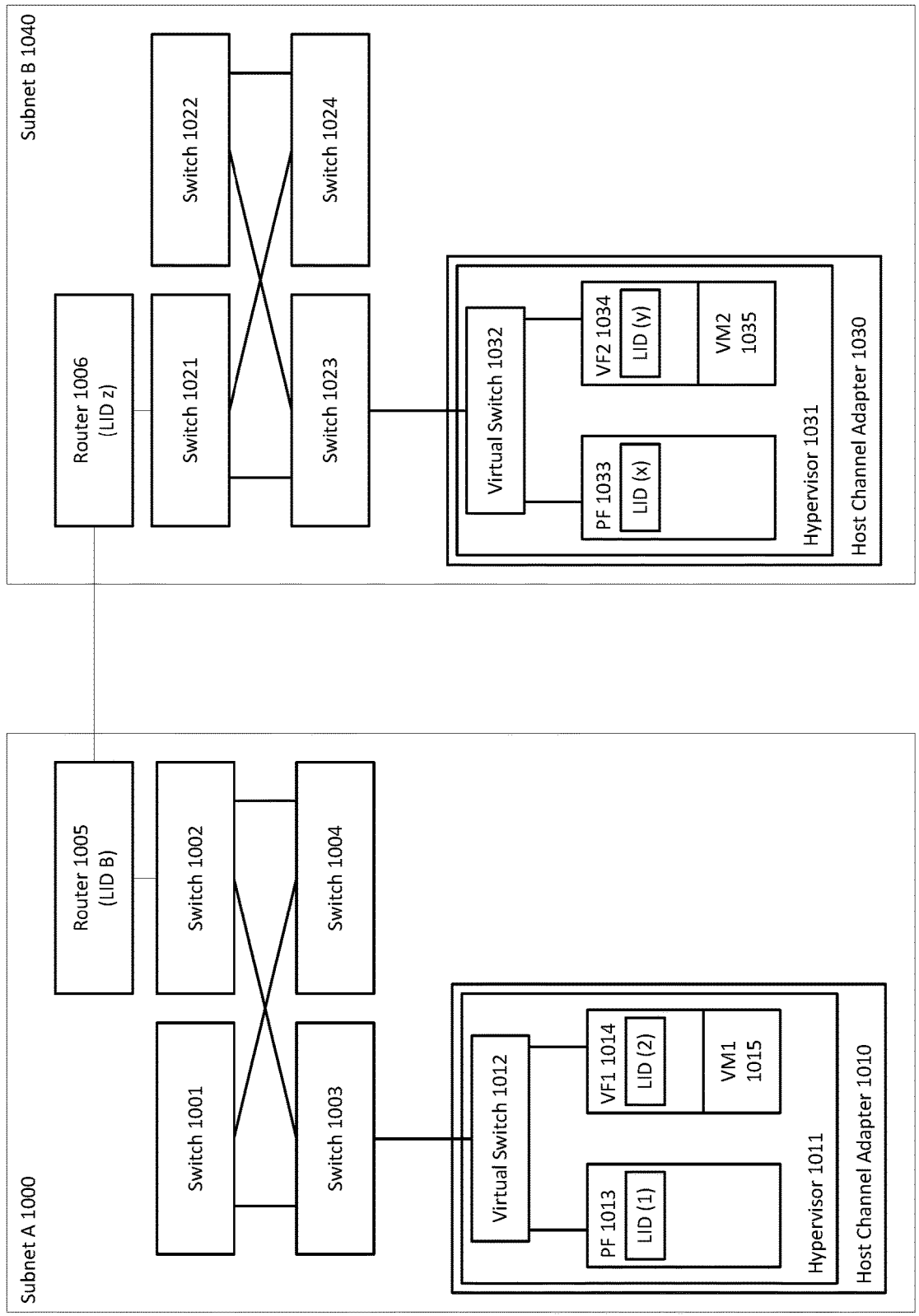
FIG. 10 shows an exemplary multi-subnet InfiniBand™ fabric, in accordance with an embodiment.

FIG. 10 shows an exemplary multi-subnet InfiniBand™ fabric, in accordance with an embodiment. As depicted in the figure, within subnet A 1000, a number of switches 1001-1004 can provide communication within subnet A 1000 (e.g., an IB subnet) between members of a fabric, such as an InfiniBand™ fabric. The fabric can include a number of hardware devices, such as, for example, channel adapter 1010. Host channel adapters 1010 can in turn interact with a hypervisor 1011. The hypervisor can, in turn, in conjunction with the host channel adapter it interacts with, setup a number of virtual functions 1014. The hypervisor can additionally assign virtual machines to each of the virtual functions, such as virtual machine 1 1015 being assigned to virtual function 1 1014. The hypervisor can access their associated host channel adapters through a fully featured physical function, such as physical function 1013, on each of the host channel adapters.

With further reference to FIG. 10, and in accordance with an embodiment, a number of switches 1021-1024 can provide communication within subnet B 1040 (e.g., an IB subnet) between members of a fabric, such as an InfiniBand™ fabric. The fabric can include a number of hardware devices, such as, for example, host channel adapter 1030. Host channel adapter 1030 can in turn interact with a hypervisor 1031. The hypervisor can, in turn, in conjunction with the host channel adapter it interacts with, setup a number of virtual functions 1034. The hypervisors can additionally assign virtual machines to each of the virtual functions, such as virtual machine 2 1035 being assigned to virtual function 2 1034. The hypervisor can access their associated host channel adapters through a fully featured physical function, such as physical function 1033, on each of the host channel adapters. It is noted that, although only one host channel adapter is shown within each subnet (i.e., subnet A and subnet B), it is to be understood that a plurality of host channel adapters, and their corresponding components, can be included within each subnet.

In accordance with an embodiment, each of the host channel adapters can additionally be associated with a virtual switch, such as virtual switch 1012 and virtual switch 1032, and each HCA can be set up with a different architecture model, as discussed above. Although both subnets within FIG. 10 are shown as using a vSwitch with prepopulated LID architecture model, this is not meant to imply that all such subnet configurations must follow a similar architecture model.

In accordance with an embodiment, at least one switch within each subnet can be associated with a router, such as switch 1002 within subnet A 1000 being associated with router 1005, and switch 1021 within subnet B 1040 being associated with router 1006.

In accordance with an embodiment, when traffic at an originating source, such as virtual machine 1 within subnet A, is addressed to a destination at a different subnet, such as virtual machine 2 within subnet B, the traffic can be addressed to the router within subnet A, i.e., router 1005, which can then pass the traffic to subnet B via its link with router 1006.

TCAM Based Policing of Network Traffic Flow

Within an InfiniBand™ (IB) fabric, it is possible that many different logical network traffic flows exist between several independent end-ports. These logical traffic flows can share the same links, and consequently, the same switch ports. Moreover, for a single IB end-port, a large number of logical flows can be active concurrently. These concurrent logical flows can represent, for example, different partitions and/or different sessions with, or connections to, one or more remote communication peers.

In accordance with an embodiment, when a switch implementation uses independent physical forwarding tables at each ingress port, it is possible to implement restrictions on what destinations, or which next-step routes, traffic from that ingress port is allowed to be forwarded to. For example, if the ingress port represents traffic from a specific end-port, then the destinations and routes that can be used by the specific end-port can be restricted in the physical forwarding table of the ingress port. However, the use of forwarding tables is not sufficient in order to make more granular restrictions than a destination LID or a next-step port.

In accordance with an embodiment, a ternary content addressable memory (TCAM) based structure can be used to support regulating the flow of network traffic to specific communication types, or between a given combination of source nodes and destination nodes. Using a TCAM based structure, a number of TCAM entries can be associated with a physical IB port. Each TCAM entry associated with the physical port can be configured to match a set of IB packet header values using combinations of literal matches and mask fields (sometimes referred to as "wildcard" fields) in the various TCAM entries. In this way, it is possible to set up one or more such TCAMs to dynamically represent one or more logical flows or groups of flows. Once the associated TCAM entries are configured to represent specific logical flows, the represented logical flows can be allowed or dropped based on matches to the TCAM entries by packet header values that have been aggregated into search data and formatted for use with the TCAM.

Figure 11:
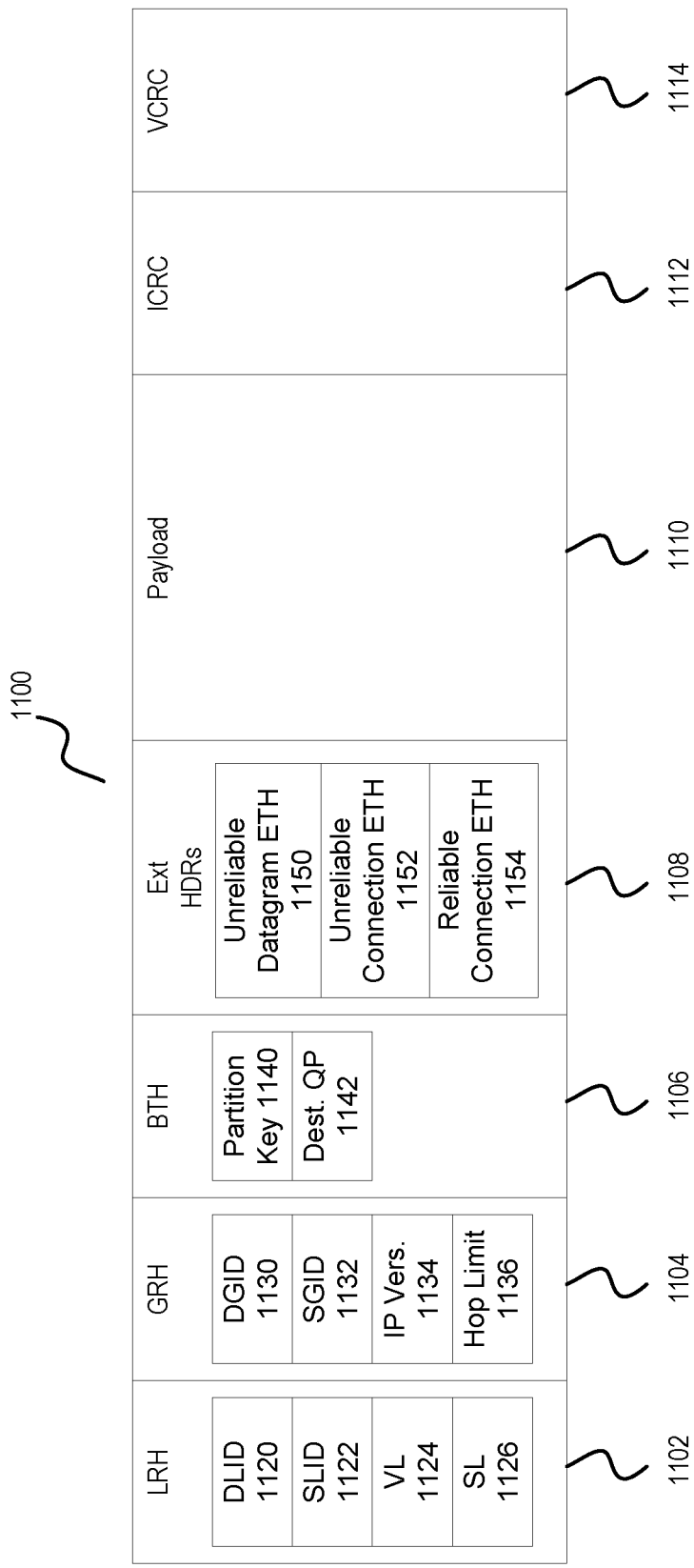
FIG. 11 shows a block diagram of an exemplary data packet, including packet header fields, in accordance with an embodiment.

FIG. 11 shows a block diagram of an exemplary IB packet, including packet header fields, in accordance with an embodiment. InfiniBand™ packet 1100 includes local route header (LRH) 1102, global route header (GRH) 1104, base transport header (BTH) 1106, and extended headers 1108. IB packet 1100 also includes payload 1110, invariant cyclic redundancy check 1112 and variant cyclic redundancy check 1114.

With continued reference to FIG. 11, LRH 1102 can contain information such as a destination local identifier (DLID) 1120, a source local identifier (SLID) 1122, a virtual lane (VL) 1124, and a service level (SL) 1126, among other information. GRH 1104 can contain information such as a destination global identifier (DGID) 1130, a source global identifier (SGID) 1132, an IP version 1134, and a hop limit 1136, among other information. Base transport header can contain information such as a partition key 1140 and a destination queue pair (QP) 1142, among other information. The extended headers field can contain information such as a unreliable datagram extended transport header (ETH) 1150, a unreliable connection ETH 1152, and reliable connection ETH 1154. Other information in the extended headers field can include a reliable datagram ETH, a datagram ETH, a remote direct memory access (RDMA) ETH, and an atomic ETH (each, not shown), among other information.

In accordance with an embodiment, the information contained in the headers of an IB data packet can represent logical flows and classes of logical flows. For instance, all data packets containing a similar destination QP value represent a logical data flow of that QP at the relevant end-port which the destination QP value represents. The data flow is a logical data flow, because these packets can use the same physical port(s) as packets having a different destination QP value, yet the packets can be logically differentiated from other packets due to the fact that they have a similar destination QP value. By associating a TCAM, or a plurality of TCAM entries, with a physical IB port and configuring the entries in the TCAM to match a set of IB data packet header values (where a set is one or more packet header values), logical data flows can be policed by tracking matches to the various TCAM entries.

Figure 12:
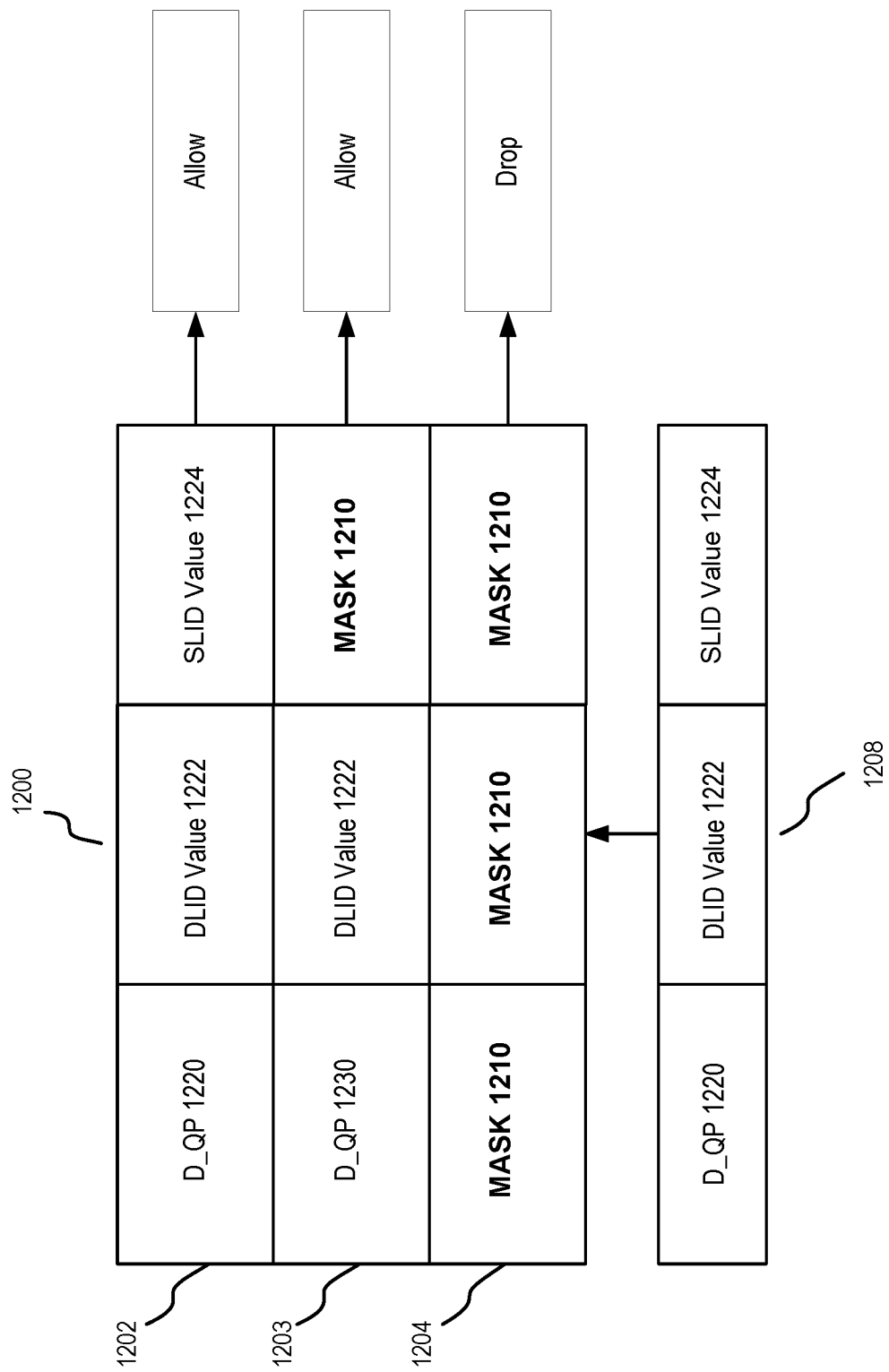
FIG. 12 shows a block diagram of an exemplary TCAM used to police network traffic, in accordance with an embodiment.

FIG. 12 shows a block diagram of an exemplary ternary content addressable memory (TCAM) used to police network traffic, in accordance with an embodiment. TCAM 1200 includes entries 1202-1204 (each entry represented by an entire row in the matrix). Each entry 1202-1204 can hold a fixed amount of data. The data in each entry is stored as bits. Thus, each entry contains a fixed amount of bits (e.g., each entry can contain 64, 128, or some other number of bits). For purposes of clarity, FIG. 12 shows abstractions of data, rather than actual bits. For example, entry 1202 shows DLID value 1222, rather than the actual 16 bits that can define a DLID. Likewise, entry 1202 shows (in addition to DLID value 1222) SLID value 1224 rather than the actual 16 bits that can define an SLID, and destination QP value D_QP 1220 rather than the actual bits that can define a destination QP. This is for illustrative purposes only, and one skilled in the art will appreciate that, in practice, the actual bit representations of these values would be used in the TCAM entries and the search data.

Additionally, all or part of each entry in a TCAM can be masked. Upon a search of the TCAM entries, masked bits in a TCAM entry always result in a match—regardless of what bits (either a 1 or a 0) they are compared to during the search. For instance, entry 1203 of TCAM 1200 contains destination queue pair value D_QP 1230 in the left-most part of the entry, while the right-most part of the entry contains MASK 1210. Thus, any data compared to the right-most bit space of entry 1203 will result in a match, but data compared to the left-most bit space of entry 1203 must match the value of D_QP 1230 in order to match that space. Likewise, data compared to the middle bit space of entry 1203 must match DLID value 1222 to match the middle bit space of entry 1203.

In accordance with an embodiment, the TCAM in FIG. 12 is configured to allow only packets whose destination is DLID 1222. For instance, any packet whose source LID matches SLID value 1224, whose destination matches DLID value 1222, and whose destination QP value matches D_QP 1220 is forwarded and not dropped, per entry 1202. Likewise any packet destined for D_QP 1230 at DLID 1222 is forwarded and not dropped, per entry 1203. In entry 1203, the SLID of the packet does not matter, because that bit space that corresponds to an SLID extracted from a packet header in entry 1203 contains mask bits. Thus, any SLID will match that corresponding bit space. All other packets can only match the default entry 1204. Entry 1204 is a default entry because all of the bits in entry 1204 are mask bits, and as such, any search data will match entry 1204. Moreover, TCAM 1200 is configured to drop any packet whose corresponding search data matches entry 1204.

With continued reference to FIG. 12, search data 1208 contains data retrieved from an IB packet header. For instance, destination QP value D_QP 1220 can be retrieved from the BTH header of an IB packet (e.g., BTH 1106 of IB packet 1000, depicted in FIG. 11). Likewise, DLID value 1222 and SLID value 1224 can be retrieved from the local route header of the same IB packet after the packet is received at the associated IB port. Search data 1208 can be compared to each entry in TCAM 1200. Based on what TCAM entry search data 1208 matches, the packet can either be allowed or dropped.

In accordance with an embodiment, it is possible that search data 1208 can match more than one TCAM entry. This can cause an issue when TCAM entries that the search data matches conflict on whether to allow or drop the packet. For example, in FIG. 12, search data 1208 contains destination QP value D_QP 1220, DLID value 1222, and SLID value 1224, each retrieved from the packet headers of an incoming packet at the associated port. When a search is conducted across the entries of TCAM 1200, matches will result in all entries (i.e., entries 1202, 1203, and 1204). A match will result in entry 1202, because all data across search data 1208 exactly matches the data in entry 1202 of the TCAM. Matches will likewise occur with entries 1203 and 1204 due to a mix of literal matches and masked bits. However, entries 1202 and 1203 are in conflict with entry 1204 as to whether to allow or drop the packet.

In order to avoid such conflicts, the TCAM entries can be assigned a priority, and can be configured to perform the packet allow/drop action based on the action value of the entry having the highest priority. For example, in FIG. 12, the priority of the entries may be configured in order of descending priority, such that entry 1202 holds the highest priority and entry 1203 holds the lowest priority. In such a configuration, search data 1208 would produce a match with each TCAM entry 1202-1204. However, only the allow action of entry 1202 would be performed, since entry 1202 has a higher priority than either 1203 or 1204. In this way, even though search data 1208 matches entry 1204, the packet will not be dropped, but rather, will be correctly forwarded.

The packet header data used in FIG. 12 is meant to be exemplary, and any packet header field value can be used in a similar fashion. For example, packets can be allowed or dropped based on IB packet type (e.g., unreliable datagram, unreliable connection, reliable connection), queue key value, partition key value, and even packet payload values. Moreover, by combining a plurality of the available packet header values using combinations of literal matches and mask bits, very fine-grained access control and packet policing can be implemented.

In accordance with an embodiment, TCAM entries configured as described above can be associated with hardware counters in order to monitor the frequency with which each allow/drop action is utilized. For example, a TCAM entry can be configured to increment an associated counter each time the entry's allow drop action is performed.

One advantage of using a TCAM for updating counters is that the search data can be compared with each TCAM entry in parallel, thereby providing faster search results than a random access memory or algorithmic searching. Further, in embodiments where the TCAM is configured to update counters associated with each TCAM entry that matches the search data (rather than with a single entry based, e.g., on a numerical ID associated with the TCAM entry), each counter can be updated in parallel, as well.

Figure 13:
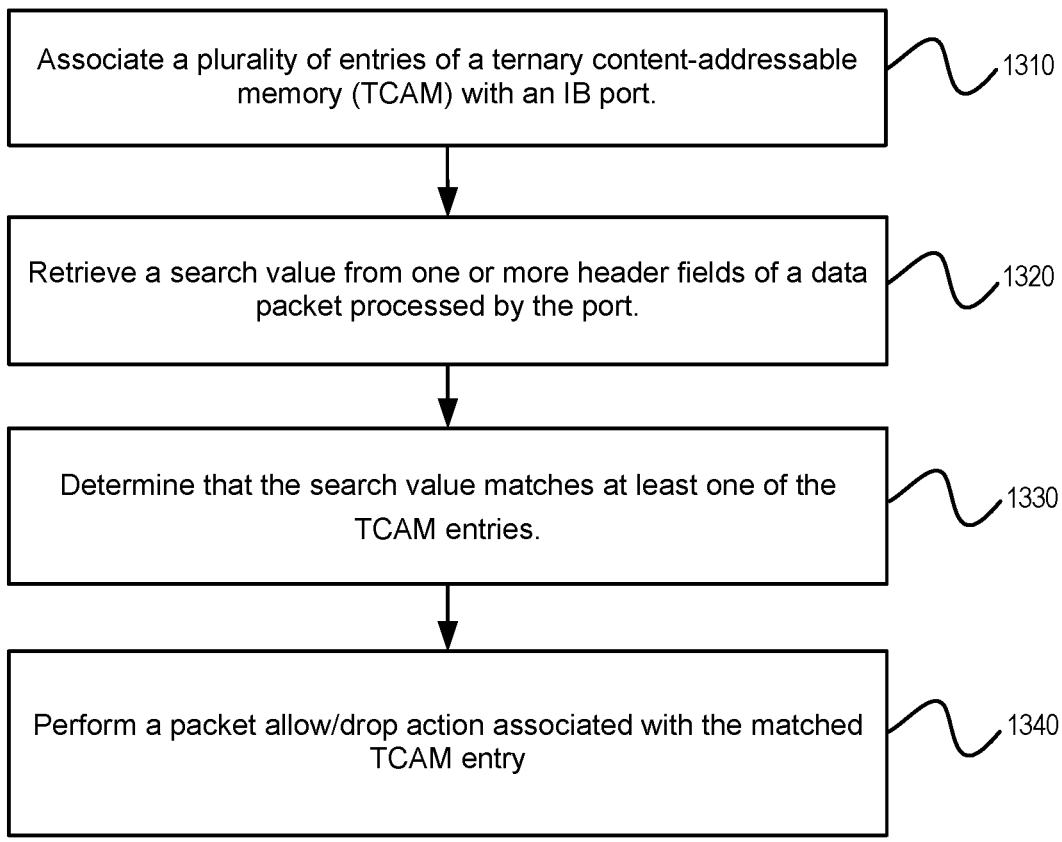
FIG. 13 is a flow chart for TCAM based network traffic flow policing, in accordance with an embodiment.

FIG. 13 is a flow chart for TCAM based network traffic flow policing, in accordance with an embodiment.

At step 1310, a plurality of entries of a ternary content-addressable memory (TCAM) are associated with an IB port.

At step 1320, a search value is retrieved from one or more header fields of a data packet processed by the port.

At step 1330, a determination is made that the search value matches at least one of the TCAM entries.

At step 1340, a packet allow/drop action associated with the matched TCAM entry is performed.

Figure 14:
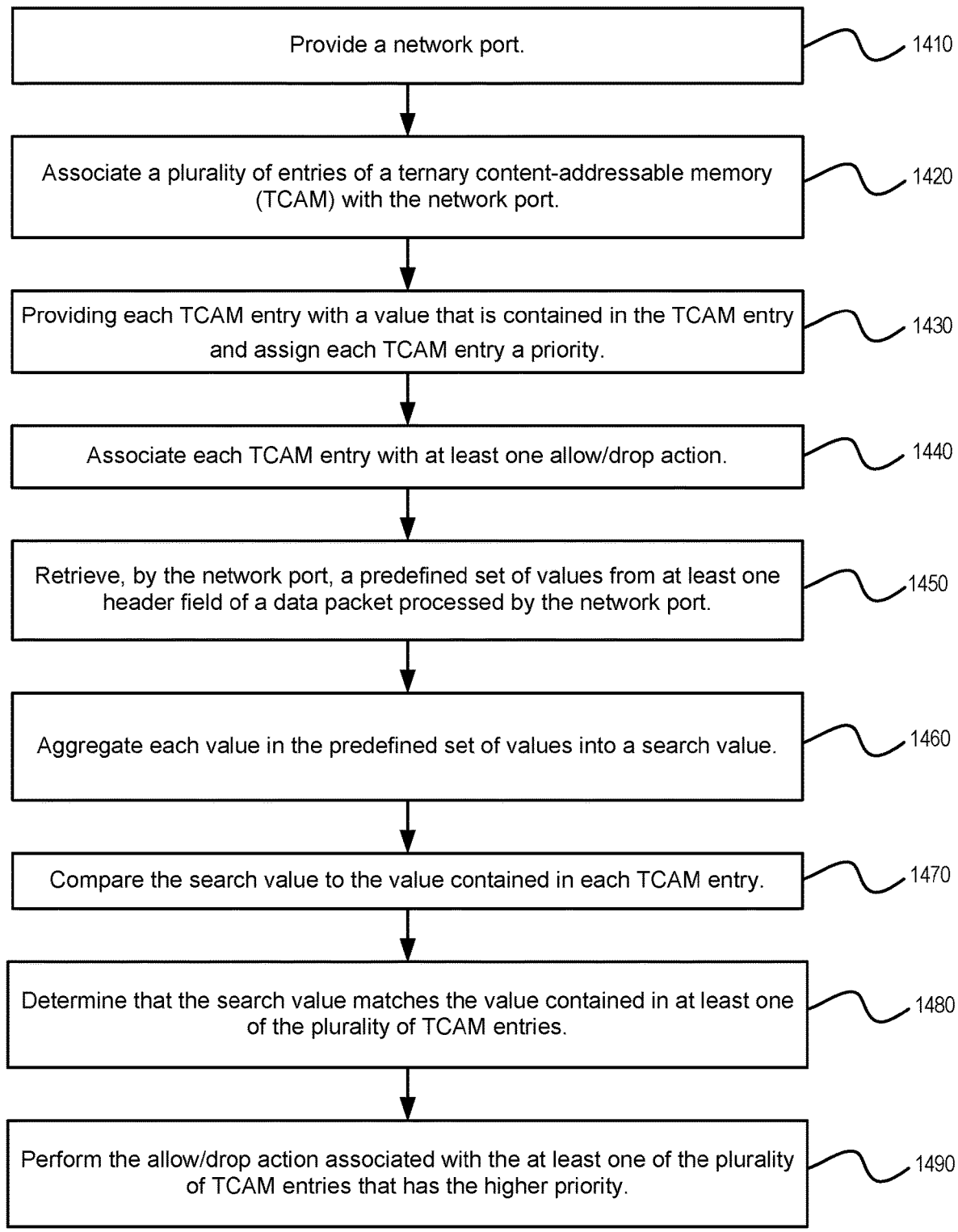
FIG. 14 is a detailed flow chart for TCAM based network traffic flow policing, in accordance with an embodiment.

FIG. 14 is a detailed flowchart for TCAM based network traffic flow policing, in accordance with an embodiment.

At step 1410, a network port is provided.

At step 1420, a plurality of entries of a TCAM are associated with the network port.

At step 1430, each TCAM entry is provided with a value, where the value is stored in the TCAM entry, and each TCAM entry is assigned a priority.

At step 1440, each TCAM entry is associated with at least one allow/drop action.

At step 1450, the network port retrieves a predefined set of values from at least one header field of a data packet processed by the network port.

At step 1460, each value in the predefined set of values is aggregated into a search value.

At step 1470, the search value is compared to the value stored in each TCAM entry.

At step 1480, It is determined that the search value matches the value stored in at least one of the plurality of TCAM entries.

At step 1490, the allow/drop action associated with the at least one of the plurality of TCAM entries if performed on the entry that has the higher priority.

Features of the present invention can be implemented in, using, or with the assistance of a computer program product which is a storage medium (media) or computer readable medium (media) having instructions stored thereon/in which can be used to program a processing system to perform any of the features presented herein. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems and execution environments/containers.

Features of the invention may also be implemented in hardware using, for example, hardware components such as application specific integrated circuits (ASICs). Implementation of the hardware state machine so as to perform the functions described herein will be apparent to persons skilled in the relevant art.

Additionally, the present invention may be conveniently implemented using one or more conventional general purpose or specialized digital computer, computing device, machine, or microprocessor, including one or more processors, memory and/or computer readable storage media programmed according to the teachings of the present disclosure. Appropriate software coding can readily be prepared by skilled programmers based on the teachings of the present disclosure, as will be apparent to those skilled in the software art.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The foregoing description of the present invention has been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

What is claimed is:

1. A method of policing network traffic flows on an InfiniBand (IB) network fabric, comprising:

providing a network port that operates on the IB network fabric, wherein traffic through the network port is restricted a partition;

providing a ternary content-addressable memory (TCAM) at the network port, wherein the TCAM includes a plurality of entries, and wherein the TCAM is used in enforcing restrictions on data packets belonging to the partition;

providing each entry of the plurality of TCAM entries with a value, wherein the value is stored in the TCAM entry;

including, in the value of a first entry of the plurality of TCAM entries, a bit string that defines a destination queue pair of the network port;

assigning each entry of the plurality of TCAM entries a priority;

associating each entry of the plurality of TCAM entries with at least one allow/drop action;

retrieving, by the network port, a predefined set of values from at least one header field of a data packet processed by the network port, wherein the predefined set of values includes a destination queue pair, and wherein the data packet is a member of the partition;

aggregating each value in the predefined set of values into a search value;

comparing the search value to the value stored in each entry of the plurality of TCAM entries;

determining that the search value matches the first entry of the plurality of TCAM entries based at least partly on the destination queue pair corresponding to the bit string that defines the destination queue pair of the network port;

determining that the first entry of the plurality of TCAM entries has a higher priority than any other entry of the plurality of TCAM entries that the search value matches; and performing the allow/drop action associated with the first entry of the plurality of TCAM entries.

2. The method of claim 1, comprising:

including mask bits in at least one of the plurality of TCAM entries.

3. The method of claim 2, wherein the mask bits mask a portion of the TCAM entry that is compared to a corresponding portion of the search data, and wherein the corresponding portion of the search data represents a distinct value retrieved from the at least one header field of the data packet as part of the predefined set of values.

4. The method of claim 3, wherein the distinct value is a destination local identifier value.

5. The method of claim 1, wherein the plurality of TCAM entries includes a default entry, and wherein the default entry has the lowest priority of any entry in the plurality of TCAM entries.

6. The method of claim 5, wherein the default entry consists entirely of mask bits.

7. The method of claim 1, comprising:

associating a counter with each of the plurality of TCAM entries; and incrementing the corresponding counter whenever the allow/drop action associated with a particular TCAM entry is performed.

8. A system for policing network traffic flows on an InfiniBand (IB) network fabric comprising:

a network device including a processor and a network port that operates on the IB network fabric, wherein traffic through the network port is restricted a partition;

a ternary content-addressable memory (TCAM) at the network port, wherein the TCAM includes a plurality of entries associated with the network port, and wherein the TCAM is used in enforcing restrictions on data packets belonging to the partition, wherein each TCAM entry of the plurality of TCAM entries is provided with a value and the value is stored in the TCAM entry, wherein the value of a first entry of the plurality of TCAM entries includes a bit string that defines a destination queue pair of the network port;

wherein each TCAM entry of the plurality of TCAM entries is associated with at least one network counter, wherein each TCAM entry of the plurality of TCAM entries is assigned a priority, and wherein each TCAM entry of the plurality of TCAM entries is associated with at least one allow/drop action; and wherein the network device operates to:

retrieve a predefined set of values from at least one header field of a data packet processed by the network port, wherein the predefined set of values includes a destination queue pair, and wherein the data packet is a member of the partition;

aggregate each value in the predefined set of values into a search value;

compare the search value to the value stored in each TCAM entry of the plurality of TCAM entries;

determine that the search value matches the first entry of the plurality of TCAM entries based at least partly on the destination queue pair corresponding to the bit string that defines the destination queue pair of the network port;

determine that the first entry of the plurality of TCAM entries has a higher priority than any other entry of the plurality of TCAM entries that the search value matches; and perform the allow/drop action associated with the first entry of the plurality of TCAM entries.

9. The system of claim 8, wherein at least one of the plurality of TCAM entries includes mask bits.

10. The system of claim 9, wherein the mask bits mask a portion of the TCAM entry that is compared to a corresponding portion of the search data, and wherein the corresponding portion of the search data represents a distinct value retrieved from the at least one header field of the data packet as part of the predefined set of values.

11. The system of claim 10, wherein the distinct value is a destination local identifier value.

12. The system of claim 8, wherein the plurality of TCAM entries includes a default entry, and wherein the default entry has the lowest priority of any entry in the plurality of TCAM entries.

13. The system of claim 12, wherein the default entry consists entirely of mask bits.

14. The system of claim 8, wherein the network device further operates to:

associate a counter with each TCAM entry of the plurality of TCAM entries; and increment the corresponding counter whenever the allow/drop action associated with a particular TCAM entry is performed.

15. A non-transitory computer readable storage medium, including instructions stored thereon for policing network traffic flows on an InfiniBand (IB) network fabric, which when read and executed by one or more computers cause the one or more computers to perform steps comprising:

providing a network port that operates on the IB network fabric, wherein traffic through the network port is restricted a partition;

providing a ternary content-addressable memory (TCAM) at the network port, wherein the TCAM includes a plurality of entries, and wherein the TCAM is used in enforcing restrictions on data packets belonging to the partition;

providing each entry of the plurality of TCAM entries with a value, wherein the value is stored in the TCAM entry;

including, in the value of a first entry of the plurality of TCAM entries, a bit string that defines a destination queue pair of the network port;

assigning each entry of the plurality of TCAM entries a priority;

associating each entry of the plurality of TCAM entries with at least one allow/drop action;

retrieving, by the network port, a predefined set of values from at least one header field of a data packet processed by the network port, wherein the predefined set of values includes a destination queue pair, and wherein the data packet is a member of the partition;

aggregating each value in the predefined set of values into a search value;

comparing the search value to the value stored in each entry of the plurality of TCAM entries;

determining that the search value matches the first entry of the plurality of TCAM entries based at least partly on the destination queue pair corresponding to the bit string that defines the destination queue pair of the network port;

determining that the first entry of the plurality of TCAM entries has a higher priority than any other entry of the plurality of TCAM entries that the search value matches; and performing the allow/drop action associated with the first entry of the plurality of TCAM entries.

16. The non-transitory computer readable storage medium of claim 15, the steps further comprising:

including mask bits in at least one of the plurality of TCAM entries.

17. The non-transitory computer readable storage medium of claim 16, wherein the mask bits mask a portion of the TCAM entry that is compared to a corresponding portion of the search data, and wherein the corresponding portion of the search data represents a distinct value retrieved from the at least one header field of the data packet as part of the predefined set of values.

18. The non-transitory computer readable storage medium of claim 17, wherein the distinct value is a destination local identifier value.

19. The non-transitory computer readable storage medium of claim 15, wherein the plurality of TCAM entries includes a default entry, and wherein the default entry has the lowest priority of any entry in the plurality of TCAM entries.

20. The non-transitory computer readable storage medium of claim 19, wherein the default entry consists entirely of mask bits.

* * * * *